(12) United States Patent
Matsunaga et al.

(10) Patent No.: US 8,737,158 B2
(45) Date of Patent: May 27, 2014

(54) SEMICONDUCTOR DEVICE AND METHOD OF CONTROLLING THE SAME

(76) Inventors: Kinu Matsunaga, Tokyo (JP); Hiroshi Akamatsu, Tokyo (JP)

( * ) Notice: Subject to any disclaimer, the term of this patent is extended or adjusted under 35 U.S.C. 154(b) by 86 days.

(21) Appl. No.: 13/431,412

(22) Filed: Mar. 27, 2012

(65) Prior Publication Data

US 2012/0250435 A1    Oct. 4, 2012

(30) Foreign Application Priority Data

Mar. 28, 2011    (JP) ................ 2011-069078

(51) Int. Cl.
*G11C 8/00* (2006.01)

(52) U.S. Cl.
USPC ............. 365/230.06; 365/189.05; 365/203

(58) Field of Classification Search
USPC ......... 365/189.05, 194, 203, 230.06, 230.08, 365/201, 233.1
See application file for complete search history.

(56) References Cited

U.S. PATENT DOCUMENTS

| | | | | |
|---|---|---|---|---|
| 5,808,961 A | * | 9/1998 | Sawada | 365/233.1 |
| 6,055,209 A | * | 4/2000 | Abo | 365/233.12 |
| 6,175,534 B1 | * | 1/2001 | Taniguchi et al. | 365/233.11 |
| 6,891,393 B2 | * | 5/2005 | Sugamoto et al. | 324/762.01 |
| 8,089,817 B2 | * | 1/2012 | Inaba | 365/189.05 |

FOREIGN PATENT DOCUMENTS

| | | |
|---|---|---|
| JP | 11-144497 | 5/1999 |
| JP | 2001-126480 | 5/2001 |

* cited by examiner

*Primary Examiner* — Gene Auduong
(74) *Attorney, Agent, or Firm* — Young & Thompson

(57) ABSTRACT

A device includes a command decoder that is configured to output, in a normal operation mode, a precharge signal in response to a first type transition edge of a synchronous signal, and an active signal in response to a next first type transition edge that is next to the first type transition edge. The command decoder is configured to output, in a test mode, the precharge signal in response to a second type transition edge of the synchronous signal, and the active signal in response to a next first type transition edge that is next to the second type transition edge.

20 Claims, 11 Drawing Sheets

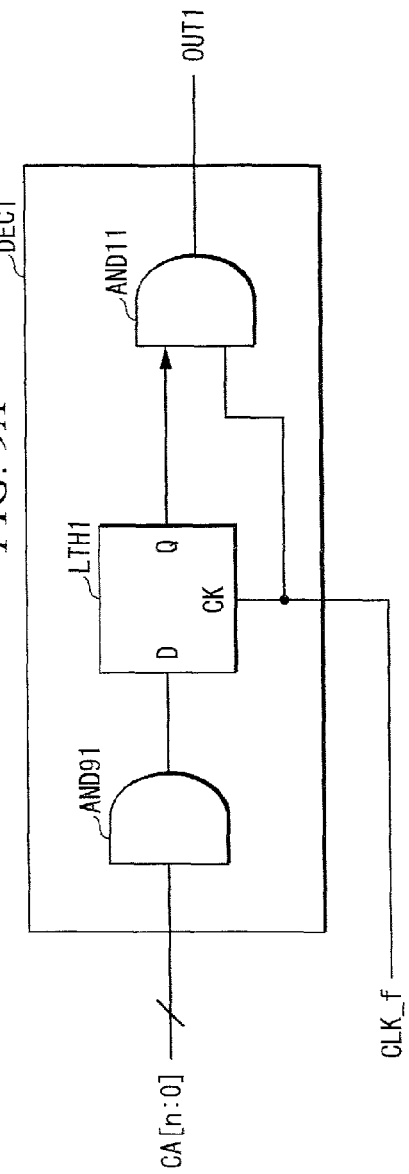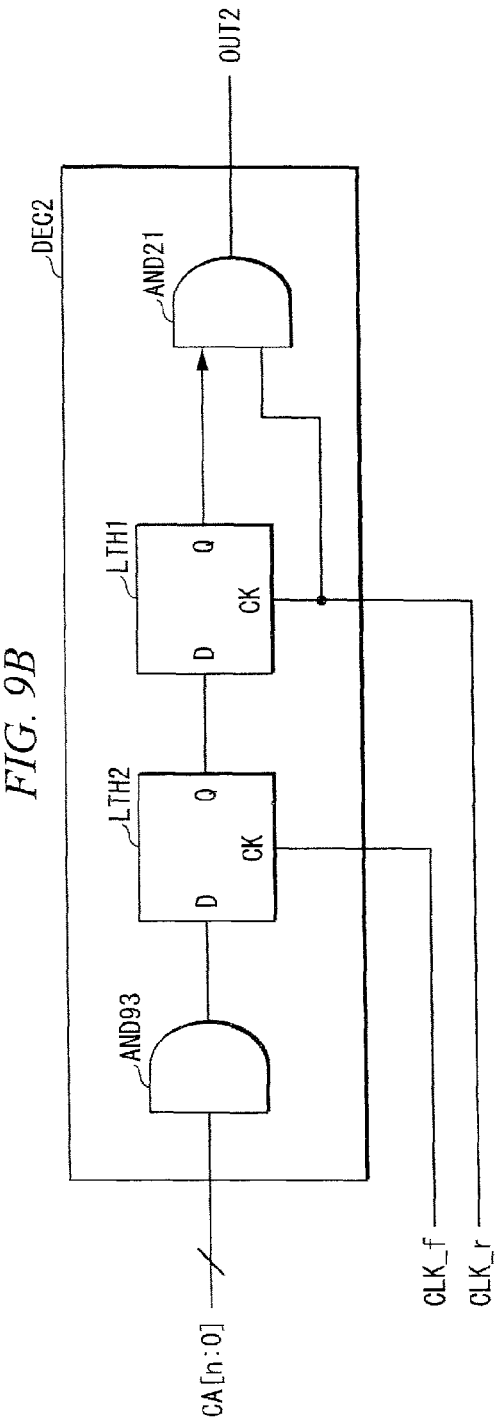

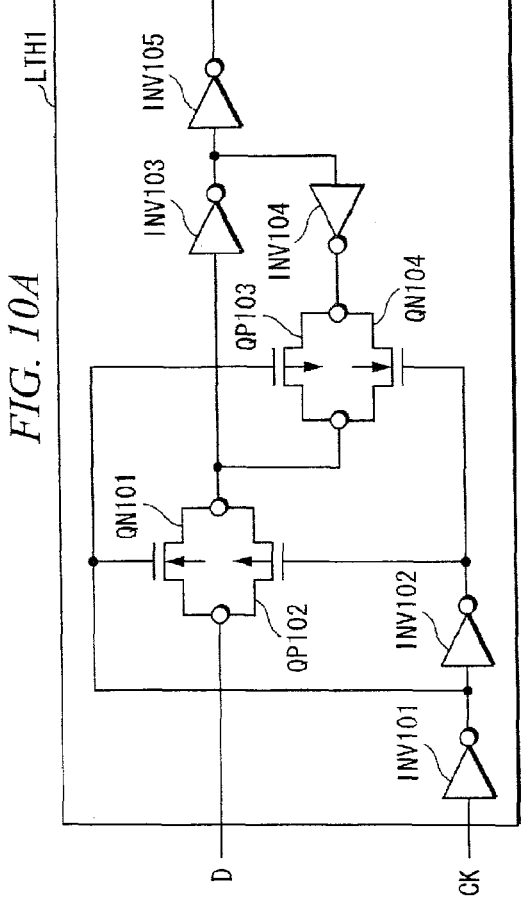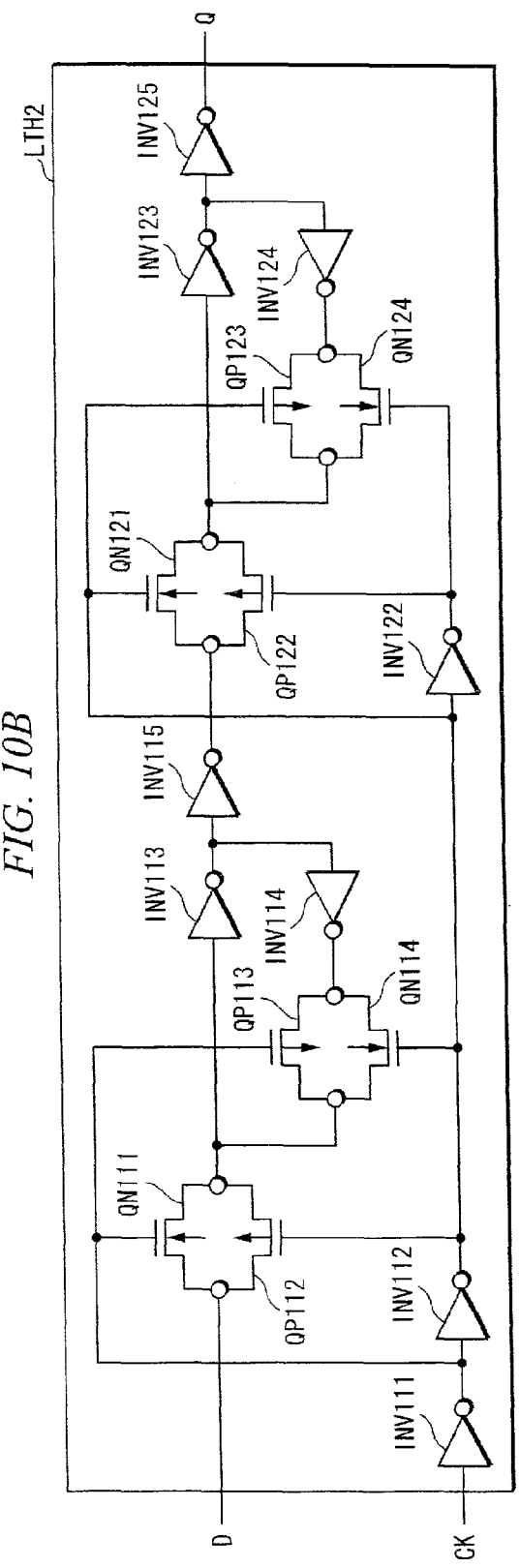

US 8,737,158 B2

SEMICONDUCTOR DEVICE AND METHOD OF CONTROLLING THE SAME

BACKGROUND OF THE INVENTION

1. Field of the Invention

The present invention generally relates to a semiconductor device and a method of controlling the same.

Priority is claimed on Japanese Patent Application No. 2011-069078, filed Mar. 28, 2011, the content of which is incorporated herein by reference.

2. Description of the Related Art

Synchronized semiconductor devices exist which operate in synchronization with an externally supplied clock signal, capture a command to activate or deactivate an internal circuit in synchronization with the clock signal, and control the operation and stopping of the internal circuit.

Japanese Patent Application Publication No. JPA 11 (1999)-144497 and Japanese Patent Application Publication No. JPA 2001-126480 disclose the followings. In the case of testing the performance of a synchronized semiconductor device, a clock signal and a command are supplied from a semiconductor device testing system (tester). In performance testing of a synchronized semiconductor device, in the case in which the period of time (tRP time) from the capture by the semiconductor device of a clock signal and pre-charge command (command that deactivates the internal circuit) until the capture of a clock signal and an activate command (command that activates the internal circuit) is made short, there is a performance limit test called a tRP test that test whether or not the semiconductor device can operate (refer to Patent Reference 1 and Patent Reference 2).

In the synchronized semiconductor device described in Patent Reference 1, the timing of generating a pre-charge signal output by a pre-charge circuit that deactivates the internal circuit is delayed by a prescribed time by a test mode signal and a delay circuit. The synchronized semiconductor device has a test circuit that, by delaying the timing of generating the pre-charge signal, delays the timing of deactivating the internal circuit and sets the tRP time to be short (refer to FIG. 22 and FIG. 23 in Japanese Patent Application Publication No. JPA 11 (1999)-144497.

SUMMARY

In one embodiment, a device may include, but is not limited to, a command decoder that is configured to output, in a normal operation mode, a precharge signal in response to a first type transition edge of a synchronous signal, and an active signal in response to a next first type transition edge that is next to the first type transition edge. The command decoder is configured to output, in a test mode, the precharge signal in response to a second type transition edge of the synchronous signal, and the active signal in response to a next first type transition edge that is next to the second type transition edge.

In another embodiment, a device may include, but is not limited to, a command decoder configured to output a precharge signal and an active signal in synchronous with a clock. A first time period between outputting the precharge signal and outputting the active signal in a test mode is shorter than a second time period of between outputting the precharge signal and outputting the active signal in a normal operation mode.

In still another embodiment, a method of controlling a device may include, but is not limited to, in a normal operation mode, outputting a precharge signal in response to a first type transition edge of a synchronous signal, and an active signal in response to a next first type transition edge that is next to the first type transition edge, and in a test mode, outputting, the precharge signal in response to a second type transition edge of the synchronous signal, and the active signal in response to a next first type transition edge that is next to the second type transition edge.

BRIEF DESCRIPTION OF THE DRAWINGS

The above features and advantages of the present invention will be more apparent from the following description of certain preferred embodiments taken in conjunction with the accompanying drawings, in which:

FIGS. 9A and 9B are logic circuit diagrams of decoders DEC1 and DEC2 in FIG. 7;

FIGS. 10A and 10B are circuit diagrams of latch circuits LTH1 and LTH2 of FIGS. 9A and 9B;

DETAILED DESCRIPTION OF THE PREFERRED EMBODIMENTS

Figure 1:
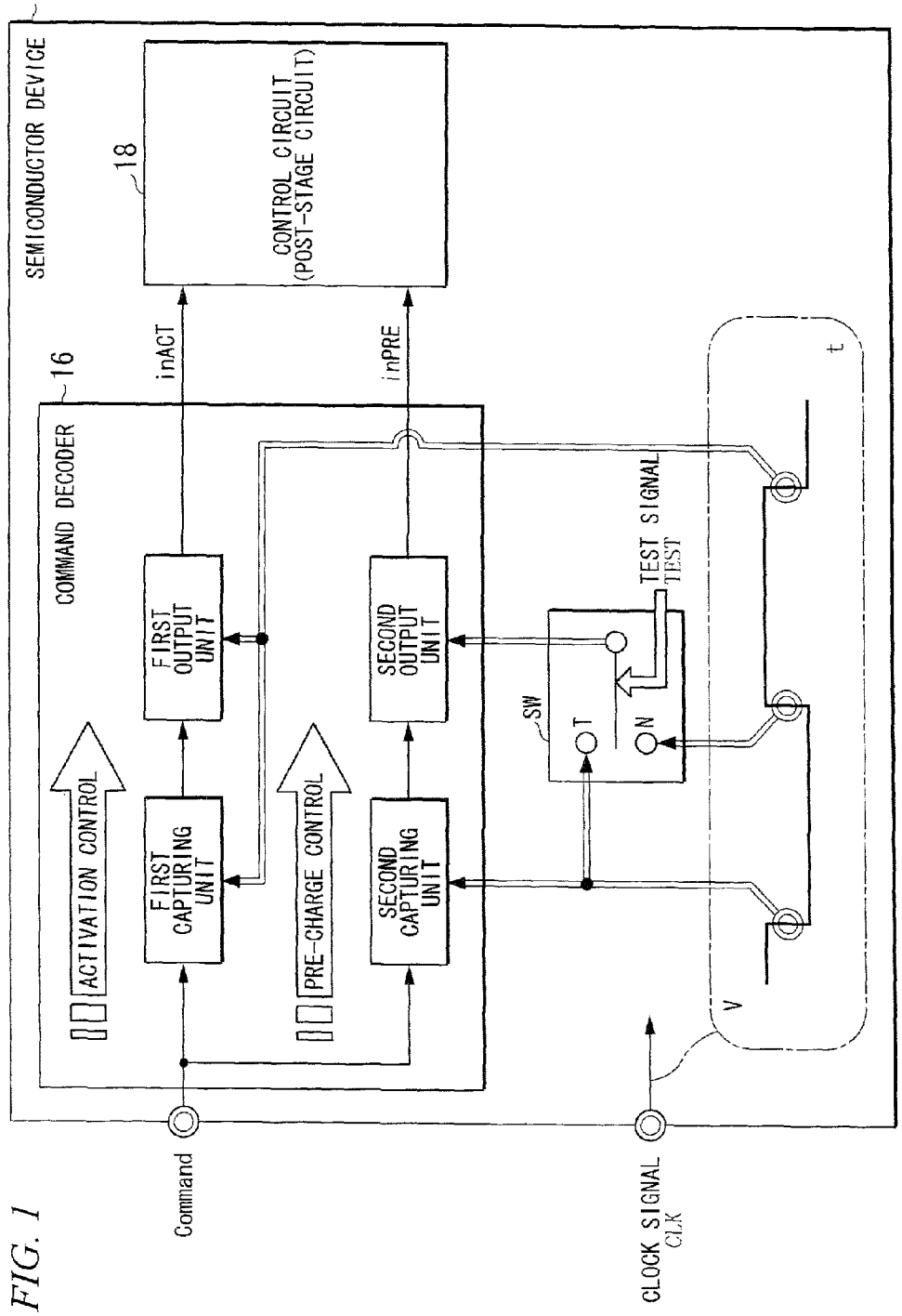
FIG. 1 is a diagram of a device including a command decoder in accordance with one or more embodiments of the present invention.

In the above-noted delay circuit, however, because of the PVT (production conditions, applied voltage, and operating temperature) of the semiconductor device the delay time varies, so that it is not possible to set the tRP time in accordance with the designed delay time, so that it is not possible to perform the tRP test with high accuracy.

In the synchronized semiconductor device described in Patent Reference 2, in order to eliminate the influence of PVT, a timing adjustment circuit is provided that varies the delay time from accepting the pre-charge command until the start of operation of the pre-charge circuit in response to a signal (latency information) indicating the period of the clock signal.

Specifically, the delay time is taken as a first delay time (4 ns) when the clock signal is a low frequency, and is taken as a second delay time (2 ns) delayed from the first delay time when the clock signal is a high frequency (refer to paragraphs 0049, 0052, 0057 and 0061 in Japanese Patent Application Publication No. JPA 2001-126480). That is, the internal delay time is varied in accordance with the differences of the operating frequencies of the synchronized semiconductor device.

In the synchronized semiconductor device noted in Japanese Patent Application Publication No. JPA 2001-126480, however, the delay time from the acceptance of the pre-charge command until the start of operation of the pre-charge circuit is a delay time that is made dependent upon the period of the clock signal. For this reason, when a tester tests the performance of the semiconductor device, for a test in which the frequency (test frequency) of the clock signal supplied to the semiconductor device is lower than the operating frequency of the semiconductor device, it is not possible to make the operation timing speed of the internal circuit when pre-charging the semiconductor device higher than that of the test frequency.

That is, the input timing of a command to the synchronized semiconductor device is always determined by the frequency of the clock signal supplied from the tester. Therefore, in the case in which a tester is used that can only supply a clock signal of a low frequency compared to the operating frequency of the semiconductor device when testing the semiconductor device, the tRP time is dependent upon the performance limit of the tester (for example, approximately 15 ns in the case of a general tester), and it is particularly difficult to measure the performance limit of a synchronized semiconductor device operating at a high speed.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a device may include, but is not limited to, a command decoder that is configured to output, in a normal operation mode, a precharge signal in response to a first type transition edge of a synchronous signal, and an active signal in response to a next first type transition edge that is next to the first type transition edge. The command decoder is configured to output, in a test mode, the precharge signal in response to a second type transition edge of the synchronous signal, and the active signal in response to a next first type transition edge that is next to the second type transition edge.

In some cases, the command decoder is configured to delay outputting the precharge signal by a half cycle of the synchronous signal, in the test mode.

In some cases, the device may further include, but is not limited to, a test mode circuit coupled to the command decoder. The test mode circuit is configured to supply a test mode signal to the command decoder. The command decoder is configured to delay supplying the precharge signal to the control circuit, upon receipt of the test mode signal from the test mode circuit.

In some cases, the device may further include, but is not limited to, a control circuit coupled to the command decoder. The command decoder is configured to supply the precharge signal to the control circuit, to enable the control circuit to perform precharge control. The command decoder is configured to supply the internal act signal to the control circuit, to enable the control circuit to start active control before the control circuit completes precharge control.

In some cases, the command decoder is configured to recognize activation of an internal circuit of the device in response to an input of an act command that is to activate the internal circuit. The command decoder is configured to recognize inactivation of the internal circuit in response to an input of a precharge command that is to inactivate the internal circuit.

In some cases, the device may further include, but is not limited to, a control circuit coupled to the command decoder. The command decoder is configured to recognize and hold a precharge command that is to inactivate the device, in response to a first type transition edge of a first cycle of the synchronous signal. The command decoder is configured to supply the precharge signal to the control circuit, in the test mode, in response to a second type transition of a second cycle next to the first cycle. The command decoder is configured to recognize an active command that is to activate the device and supply the active signal to the control circuit, in response to a first type transition edge of the second cycle.

In some cases, the device may further include, but is not limited to, a test mode circuit coupled to the command decoder. The test mode circuit is configured to recognize a mode register command in a first transition edge of a previous cycle previous to the first cycle, and to supply a test mode signal to the command decoder.

In some cases, the command decoder may further include, but is not limited to, a first capturing unit, a first output unit, a second capturing unit and a second output unit. The first capturing unit is configured to recognize and hold active operation of the device in response to the first type transition edge of the synchronous signal. The first output unit is coupled to the first capturing unit to receive the first signal from the first capturing unit and to output the first signal in response to the next first type transition edge that is next to the first type transition edge. The second capturing unit is configured to recognize and hold inactive operation of the device in response to the first type transition edge of the synchronous signal. The second output unit is coupled to the second capturing unit to receive the second signal from the second capturing unit. The second capturing unit is configured to output, in the normal operation mode, the second signal in response to the next first type transition edge. The second capturing unit is configured to output, in the test mode, the second signal in response to the second type transition edge that is next to the first type transition edge.

In some cases, the device may further include, but is not limited to, a plurality of internal circuits; and a control circuit coupled to the command decoder. The control circuit is coupled to each of the plurality of internal circuits. The control circuit is configured to supply an activation signal or an inactivation signal to each of the plurality of internal circuits, in response to the first and second signals from the first and second output units, respectively.

In some cases, the control circuit is configured to output, upon input of the first signal, a selected one of the activation signal and the inactivation signal. The selection is performed in accordance with a respective operational state of each of the plurality of internal circuits. The control circuit is configured to output, upon input of the second signal, the other of the activation signal and the inactivation signal.

In some cases, the second output unit may include, but is not limited to, a first shift unit configured to shift the second signal by a half cycle of the synchronous signal.

In some cases, the command decoder may include, but is not limited to, a delay circuit configured to delay, in the test mode, outputting the precharge signal by a half cycle of the synchronous signal.

In some cases, the device may further include, but is not limited to, a memory cell array; a row decoder coupled to the memory cell array; a sense amplifier coupled to the memory cell array; a column decoder coupled to the sense amplifier; and a control circuit coupled to the row decoder, the sense amplifier, and the column decoder. The control circuit is coupled to the command decoder to receive the precharge signal and the active signal from the command decoder.

In another embodiment, a device may include, but is not limited to, a command decoder configured to output a precharge signal and an active signal in synchronous with a clock. A first time period between outputting the precharge signal and outputting the active signal in a test mode is shorter than a second time period of between outputting the precharge signal and outputting the active signal in a normal operation mode.

In some cases, the command decoder is configured to output, in the normal operation mode, the precharge signal in response to a first type transition edge of the clock. The command decoder is configured to output, in the normal operation mode, the active signal in response to a next first type transition edge that is next to the first type transition edge. The command decoder is configured to output, in the test mode, the precharge signal in response to a second type transition edge of the clock. The second type transition edge is next to the first type transition edge. The command decoder is configured to output, in the test mode, the active signal in response to the next first type transition edge.

In some cases, the first time period is a half of the second time period.

In still another embodiment, a method of controlling a device may include, but is not limited to, in a normal operation mode, outputting a precharge signal in response to a first type transition edge of a synchronous signal, and an active signal in response to a next first type transition edge that is next to the first type transition edge, and in a test mode, outputting, the precharge signal in response to a second type transition edge of the synchronous signal, and the active signal in response to a next first type transition edge that is next to the second type transition edge.

In some cases, the method may further include, but is not limited to, the following steps. A precharge command is recognized and held in response to a first type transition edge of a first cycle of the synchronous signal; in the test mode. The precharge signal is supplied from the command decoder to a control circuit, in response to a second type transition of a second cycle next to the first cycle. An active command that is to activate the device is recognized and held. The active signal is supplied from the command decoder to the control circuit, in response to a first type transition edge of the second cycle.

In some cases, the method may further include, but is not limited to, recognizing a mode register command in a first transition edge of a previous cycle previous to the first cycle; and supplying a test mode signal to the command decoder.

In some cases, the method may further include, but is not limited to, in the test mode, performing a delay in outputting the precharge signal by a half cycle of the synchronous signal, and in the normal operation mode, performing no delay in outputting the precharge signal.

<Embodiments>

A typical example of the technical concept that solves the problem faced by the present invention will be described below. The content of the claims of the present invention, however, is not restricted to this technical concept, and the claims of the present invention encompass, of course, the language in the claims.

FIG. 1 is a drawing for describing the technical concept of the present invention.

A command decoder 16 of a semiconductor device 100 is a circuit that has a command interface function that defines the activation control operation (active control operation) and the deactivation operation (pre-charge control operation) of a control circuit 18 (post-stage circuit).

The control circuit 18 performs control operation that, based on an external command Command that is captured by the command decoder 16, outputs a control signal to various internal circuits that are connected in further subsequent stages, so as to place these internal circuits in the active state or the deactivated state (standby state).

When the command decoder 16 captures an ACT command as the command Command, it outputs an internal activate signal in ACT to the control circuit 18. When the command decoder 16 captures a PRE command, it outputs an internal pre-charge signal in PRE to the control circuit 18. The control circuit 18 adjusts the timing of the input internal activate signal in ACT and outputs control signals that activate the operation of each internal circuit to a plurality of connected internal circuits. Each of the plurality of connected internal circuits starts operating, based on the control signals input from the control circuit 18.

The control circuit 18 adjusts the timing of the input internal pre-charge signal in PRE and outputs to a plurality of connected internal circuits control signals that deactivate the operation of each internal circuit. Each of the plurality of connected internal circuits stops operating, based on the control signals input from the control circuit 18.

The command decoder 16 captures a command Command in synchronization with the external clock signal CLK. FIG. 1 shows the waveform of the clock signal CLK that is input to the command decoder 16. The clock signal CLK transitions from high level to low level (this transition being called the falling edge) and from low level to high level (this transition being called the rising edge). That is, the clock signal CLK is a signal in which the falling edge and the rising edge repeat with a prescribed period. Because the semiconductor device 100, which is a synchronized semiconductor device, captures the command Command in synchronization with either the falling edge or the rising edge of the clock signal CLK, the clock signal CLK is the synchronization signal of the semiconductor device 100.

When the command decoder 16 has a first capturing unit that captures an ACT command as the command Command and a first output unit that outputs the captured ACT command as an internal activate signal in ACT to the control circuit 18, when the control circuit 18 performs active control.

The command decoder 16 has a second capturing unit that captures a PRE command as the command Command and the first output unit that outputs the captured PRE command as an internal pre-charge signal in PRE to the control circuit 18, when the control circuit 18 performs pre-charge control.

The first capturing unit and the second capturing unit recognize the command Command and each establish the recognized command at the falling edge of the synchronization signal.

At the falling edge of the synchronization signal, the first output unit supplies the output signal of the first capturing unit that established the command as an internal activate signal in ACT to the control circuit 18.

In normal operation (non-test mode), at the falling edge of the synchronization signal, the second output unit supplies the output signal of the second capturing unit that established the command as an internal pre-charge signal in PRE to the control circuit 18. In the test mode, at the rising edge rather than the falling edge of the synchronization signal, the second output unit supplies the output signal of the second capturing unit that established the command as an internal pre-charge signal in PRE to the control circuit 18.

In this manner, in the test mode, when the PRE command is input as the command Command, the command decoder 16 switches the switch SW shown in FIG. 1 in accordance with the logic of the test mode signal TEST, causing a delay to the internal pre-charge signal in PRE of one-half of the period of the clock signal CLK, which is the synchronization signal, to supply it to the control circuit 18.

Figure 2:
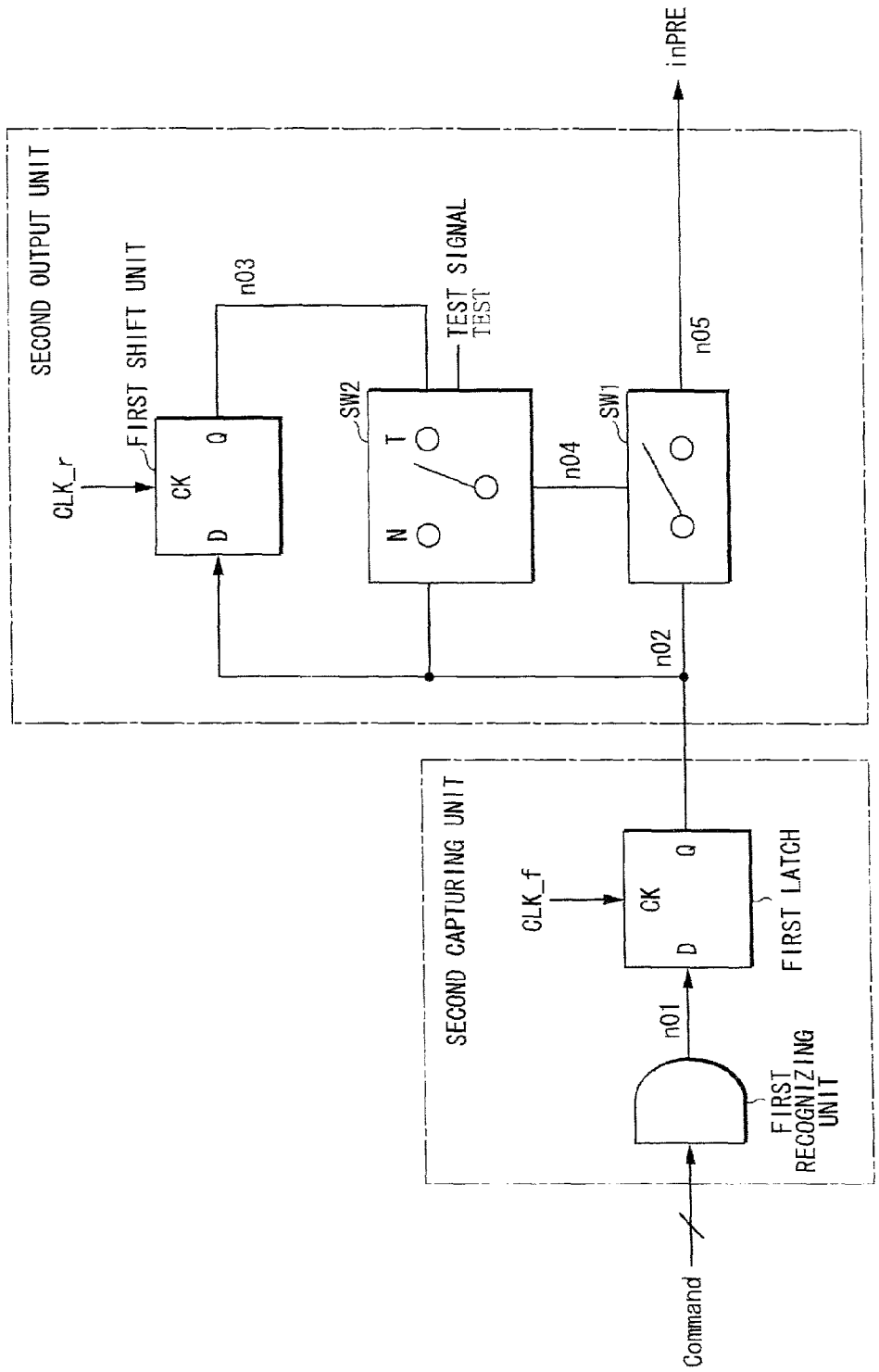
FIG. 2 is a block diagram of a configuration of the command decoder of FIG. 1.
Figure 3:
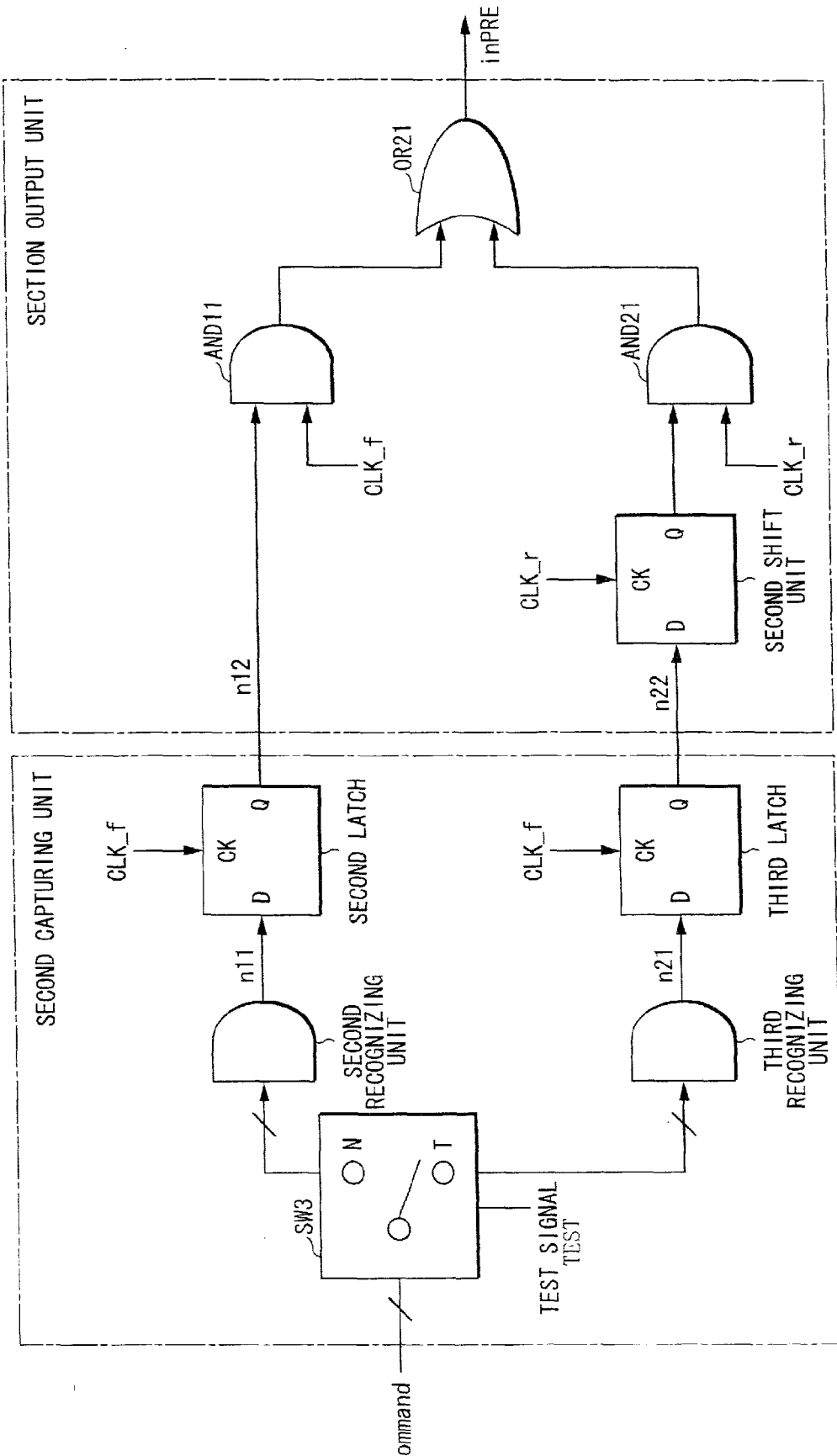
FIG. 3 is a block diagram of another configuration of the command decoder of FIG. 1.

FIG. 2 and FIG. 3 are drawings showing the constitution of the blocks for implementing the above-noted second capturing unit and second output unit. In FIG. 2 and FIG. 3, although the position of the switch SW differs between when in normal operation and when in test mode operation, they are the same with regard to the point of the internal pre-charge signal in PRE being delayed by one-half of the period of the clock signal CLK when in the test mode.

In FIG. 2, the switch SW of FIG. 1 is constituted by switch SW1 and switch SW2 and is disposed within the second output unit.

The second capturing unit is constituted by the first recognizing unit and the first latch, and the second output unit is constituted by the first shift unit and the switches SW1 and SW2.

The first recognizing unit is a decoder that recognizes a pre-charge command from, for example, a logical combination (command Command) of a plurality of control signals input from outside.

The first latch holds the level at the node n01 corresponding to an internal clock clk_f (a signal synchronized to the clock signal CLK delayed from the clock signal CLK by 180 degrees).

The first shift unit is a shifter that shifts the level at the node n02, which is the output of the first latch corresponding to the internal clock clk_r (that is, the signal of the same phase as the clock signal CLK delayed 180 degrees from the internal clock clk_f and also the opposite phase with respect to the internal clock clk_f). That is, the level at node n03, which is the output of the first shift unit, is the level at the node n02 after 0.5 clock of the clock signal CLK.

The switch SW1 is a switch that connects the node n02 to the node n05, and transfers the level at the node n02, which is the output of the first latch, to the node n05. The second output unit outputs the internal pre-charge signal in PRE from the node n05.

The switch SW2 is a switch that, in accordance with the test mode signal TEST, connects the node n02 and node n04 when in normal operation and connects the node n03 and node n04 when in test mode operation. By the level at the node n04, the node n02 and the node n05 are connected. That is, the second capturing unit and the second output unit, when in the test operating mode, delay the internal pre-charge signal in PRE by one-half of the period of the clock signal CLK.

The second capturing unit and the second output unit shown in FIG. 2 can be constituted with fewer circuit components than the second capturing unit and the second output unit in FIG. 3, which will be described next.

In FIG. 3, the switch SW shown in FIG. 1 is constituted by a switch SW3, and is disposed within the second capturing unit.

The second capturing unit is constituted by the switch SW3, the second recognizing unit, the second latch, a third recognizing unit, and a third latch, and the second output unit is constituted by a second shift unit, an AND circuit AND11, an AND circuit AND21, and an OR circuit OR21.

The switch SW3, by the logic of the test mode signal TEST, transfers the command Command to the second recognizing unit when in the normal state and transfers the command Command to the third recognizing unit when in the test mode. That is, the test mode signal TEST using the command decoder switch SW3 to make connection to the test operating mode side (T side) when in the test mode, and to make connection to the normal operation side (N side) when in normal operation.

The second recognizing unit and the third recognizing unit, are decoders that identify the pre-charge command from the logic combination of the command Command.

The second latch and the third latch hold the levels of the node n11 and the node n21, respectively, in accordance with the internal clock clk_f.

The AND circuit AND11 outputs the level at the node n12 and outputs it to the OR circuit OR21, in accordance with the internal clock clk_f.

The shift unit is a shifter that shifts the level at the node n22, which is the output of the third latch, in accordance with the internal clock clk_r. That is, the level of the output of the third latch is level at the node n22 0.5 clock (½ of the period of the clock signal CLK) after the clock signal CLK.

The AND circuit AND21 outputs the level at the node n22, which is the output of the third latch, and outputs it to the OR circuit OR21, in accordance with the internal clock clk_r.

The OR circuit OR21 outputs one of the output of the AND circuit AND11 and the output of the AND circuit AND21 as the internal pre-charge signal in PRE. That is, at the time of test mode operation, the second capturing unit and the second output unit cause a delay of the internal pre-charge signal in PRE by one-half of the period of the clock signal CLK. Although it is possible at the time of the test operating mode to use either of the circuits shown in FIG. 2 and FIG. 3 to delay the internal pre-charge signal in PRE by 0.5 clock of the clock signal CLK, in the description of the embodiments to follow, the second capturing unit and the second output unit shown in FIG. 3 are used.

Returning to FIG. 1, when in the test mode, upon inputting the PRE command as the command Command, the command decoder 16 switches the switch shown in FIG. 1 by the test mode signal TEST, delaying the internal pre-charge signal in PRE by one-half of the period of the clock signal CLK, which is the synchronization signal, and supplying it to the control circuit 18.

By doing this, in testing of the tRP time, it is possible to perform a test with ½ of the period, which is shorter than the period of the clock signal CLK. That is, in the test, the tester that supplies the clock signal CLK and the command Command to the semiconductor device 100 supplies each of the PRE command (first command) and the ACT command (second command) at the falling edge (first transition edge) of the clock signal CLK. In the semiconductor device 100, the control circuit 18 executes a control operation (active control and inactive control, respectively) with respect to the plurality of commands (ACT command and PRE command) that were recognized by the command decoder 16 in ½ of a period, which is shorter than the period of the clock signal CLK.

That is, the internal circuit that is controlled by the control circuit 18 operates under a condition with the tRP time being one-half of the period compared to when in normal operation.

By doing this, in the case of using a tester only capable of supplying a clock signal of a frequency that is lower than the operating frequency of the semiconductor device, it is possible to shorten the tRP time to one-half of the tester performance limit, thereby facilitating the measurement of the performance limit of a synchronized semiconductor device that operates at high speed.

A preferred embodiment of the present invention will be described in detail below, with references made to the drawings.

Figure 4:
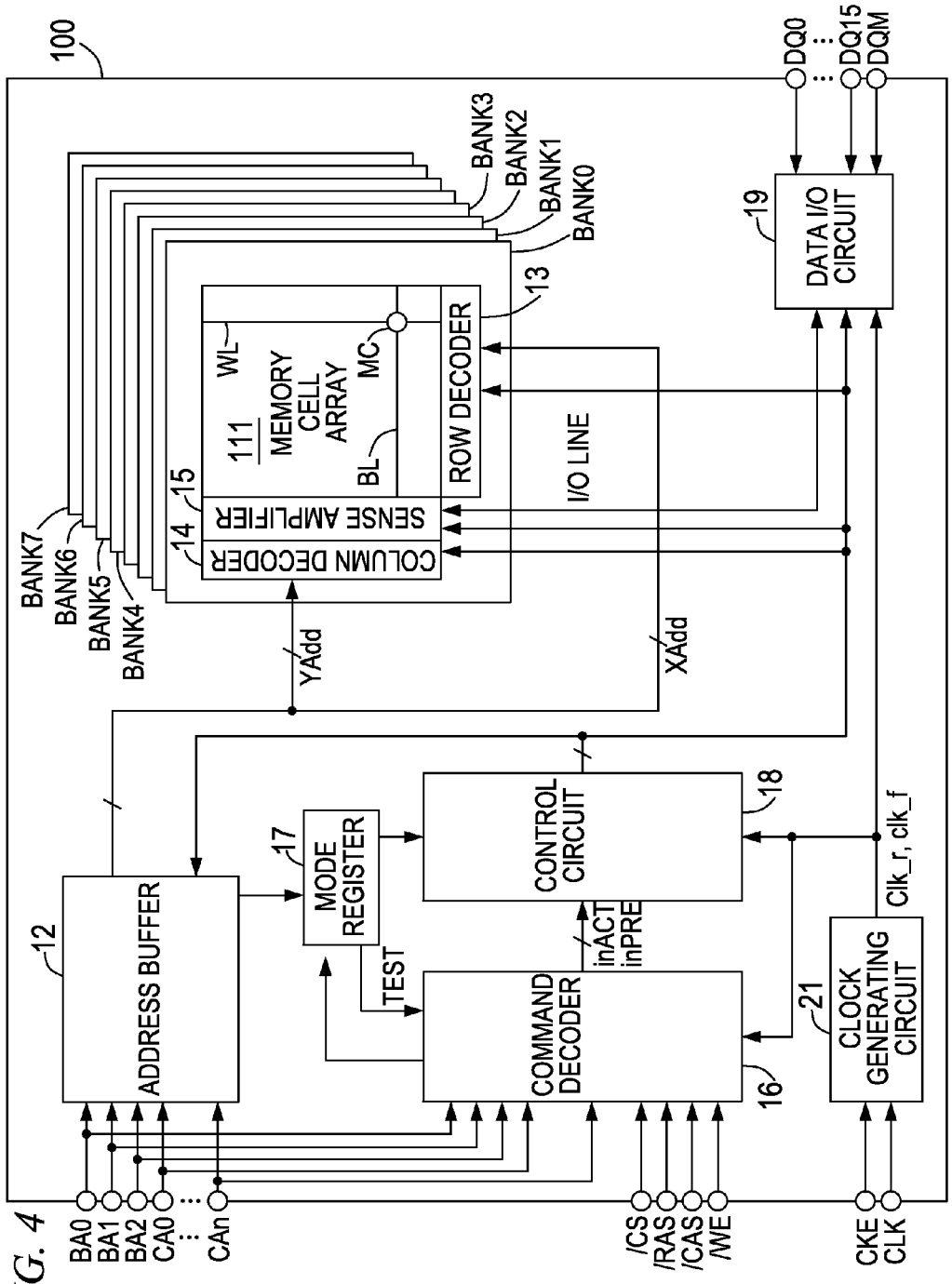
FIG. 4 is a block diagram of a semiconductor device including the device of FIG. 1.

FIG. 4 shows the general constitution of a semiconductor device, for example, the semiconductor device 100 in the case in which the present invention is applied to an SDRAM (synchronous dynamic random-access memory) that is synchronized to a clock signal supplied from outside. The various circuit blocks shown in FIG. 4 are all formed on a single semiconductor chip made of single-crystal silicon. Each of the circuit blocks are constituted by a plurality of transistors, for example, PMOS transistors (p-type channel MOS transistors), and NMOS transistors (n-type channel MOS transistors). The locations marked as circles are pads provided on the semiconductor chip for used as external terminals and, in addition to the external terminals illustrated, there is a power supply voltage terminals for application of a power supply voltage supplied from outside.

The semiconductor device 100 has a memory cell array 111, an address buffer 12, a row decoder 13, a column decoder 14, a sense amplifier 15, a command decoder 16, a mode register 17, a control circuit 18, a data input/output circuit 19, and a clock generating circuit 21.

The memory cell arrays 111 are in a plurality of banks, for example, eight banks (BANK0 to 7), which are arranged in rows and columns constituted by a plurality of memory cells arranged in a matrix. Each bank has a memory cell array 111 that is a storage area.

For example, a memory cell MC in the memory cell array 111 is disposed at the intersection of a word line and a bit line.

The clock generating circuit 21, based on the clock signal CLK of a fixed frequency supplied from outside and a clock enable signal CKE that indicates that the clock signal CLK is enabled, generates an internal clock signal that causes operation of the internal circuits (the command decoder 16, the control circuit 18, and the data input/output circuit 19). In the present embodiment, the clock generating circuit 21 generates the internal clock clk_r that is synchronized with and having the same phase as the clock signal CLK as the internal clock.

The clock generating circuit 21 also generates an internal clock clk_f that is delayed by 180 degrees from the clock signal CLK, is synchronized to the clock signal CLK, and also has a phase that is the inverse of that of the internal clock clk_r.

As control signals supplied to the semiconductor device 100 from outside, in addition to the clock signal CLK and the clock enable signal CKE, there are the following control signals. The control signals are, for example, a chip select signal /CS that places the chip in the selected condition (hereinafter, the external memory control signal CS), a row address strobe signal /RAS (hereinafter, the external memory control signal RAS), a column address strobe signal /CAS (hereinafter, the external memory control signal CAS), and a write enable signal /WE that instructs a data write operation (hereinafter, the external memory control signal WE). Of these signals, the ones prefixed by the "/" indicate signals having a low active level.

The command decoder 16 receives all or a part of the CS signal, the RAS signal, the CAS signal, and the WE signal, which are external memory control signals, and the command address signal CA, and decodes a command Command that is indicated by these signals, which are supplied from outside.

The commands supplied to the semiconductor device 100 of the present embodiment are an ACT command that instructs the activation of the internal circuits of the semiconductor device, a READ command that instructs data read-out from the semiconductor device 100, and a WRT command that instructs a data write to the semiconductor device 100. As commands supplied to the semiconductor device 100, there is the PRE command (pre-charge command) that instructs the deactivation of an internal circuit that has been activated by the ACT command, and an MRW command that instructs the setting of the operating mode to the mode register 17.

The command decoder 16 captures and decodes the CS signal, the RAS signal, the CAS signal, and the WE signal, which are external memory control signals, in synchronization with an internal clock signal taking the signals as command signals. When decoding, there are cases in which the command decoder 16 uses the command address signal CA as a supplementary code.

The command decoder 16, in response to a decoded command, for example the ACT command, the WRT command, the READ command, and the PRE command, outputs to the control circuit 18 an internal activate signal, an internal write signal, an internal read signal, and an internal pre-charge signal and the like as internal command signals.

For example, when the ACT command is captured, the command decoder 16, rather than using the command address CA as the row address, decodes CS signal, the RAS signal, the CAS signal, and the WE signal that are external memory control signals as command signals, and outputs an internal activate signal in ACT to the control circuit 18.

In contrast, when the pre-charge command (PRE command) is captured, the command decoder 16 uses the command address signal CA that is not used as the row address and the column address, decodes the CS signal, the RAS signal, the CAS signal, and the WE signal that are external memory control signals as command signals, and outputs an internal pre-charge signal in PRE to the control circuit 18.

The mode register 17, by a combination of the active levels of the CS signal, the RAS signal, the CAS signal, and the WE signal, which are external memory control signals, holds the command address signal CA, and performs initialization of the various operating mode settings, such as the entry to the test operating mode.

In the present embodiment, the mode register 17, in response to the MRW command input from outside, in the case in which test mode operation is set, outputs the test mode signal TEST having the active level (high level) to the command decoder 16, and causes the above-described switch SW3 in the command decoder 16 to be connected to the test operating mode side.

The control circuit 18, in response to the various operating modes set in the mode register and the internal command signal from the command decoder 16, generates control signals that control the various circuits of the semiconductor device 100 (the address buffer 12, the row decoder 13, the column decoder 14, the sense amplifier 15, and the data input/output circuit 19). The control circuit 18, for example, outputs the control signals that activate or inactivate the circuits such as the row decoder 13, the column decoder 14, the sense amplifier 15, and the data input/output circuit 19.

For example, the control circuit 18, in response to a change in logic level of the internal activate signal in ACT and the internal pre-charge signal in PRE, generates the timing-adjusted control signals and outputs them to the address buffer 12, the row decoder 13, and the sense amplifier 15.

The control circuit 18, in response to a change in logic level of the internal write signal or internal read signal, generates timing-adjusted control signals and outputs them to the column decoder 14 and the data input/output circuit 19.

In the condition of having been activated by the ACT command, that is, having been activated by a control signal input from the control circuit 18, the address buffer 12 internally captures address data indicating a location of a memory cell that was input from outside (hereinafter abbreviated as address), using a multiplexing method. The multiplexing method is a method whereby, by the ACT command, the row address indicating the location of a memory cell is captured and, by the READ command or WRT command, the column address indicating the location of a memory cell is captured, capturing being done in time sequence.

The address buffer 12 outputs the captured row address to the row decoder 13 as the internal row address signal XAdd and outputs the captured column address to the column decoder 14 as the internal column address YAdd.

The row decoder 13, in the condition of having been activated by the ACT command, that is, of having been activated by input of a control signal from the control circuit 18, decodes the row address captured by the address buffer 12, and selects the corresponding word line WL in the memory cell array 111. The plurality of memory cells connected to the selected word line are each connected to a bit line BL, and data stored in the memory cell MC is read out to the bit line BL.

The sense amplifier 15 is activated by the ACT command, that is, activated by the input of a control signal from the control circuit 18, and amplifies the voltage read out on the bit line. When the semiconductor device is performing a read operation, the sense amplifier 15 outputs the amplified data to the data input/output circuit 19, via a selected column switch and an I/O line. When the semiconductor device is performing a write operation, the sense amplifier 15 writes the data input from the data input/output circuit 19 via a column switch and an I/O line to the memory cell.

The column decoder 14, in the condition of having been activated by a WRT command (or a READ command) following an ACT command, that is, in the condition of having been activated by a control signal input from the control circuit 18, decodes the column address captured by the address buffer 12 and selects the corresponding column (bit line) within the memory cell array 111.

When the semiconductor device is performing a read operation, the data input/output circuit 19 outputs data read out from the memory cell array 111 via an I/O line to the outside, via the data input/output terminals DQ0 to DQ15. The data input/output circuit 19 also latches data input from the outside via the data input/output terminals DQ0 to DQ15 in a write operation and supplies the data to the sense amplifier 15 via the I/O line. The data input/output circuit 19 is constituted, so as to determine, for example, whether or not to mask (enable) the 16 bits of data, DQ0 to DQ15, based on the control signal DQM supplied from outside.

In this case, the operation of the control circuit 18 outputting a plurality of control signals, based on the internal activate signal in ACT or the internal pre-charge signal in PRE and performing activation or deactivation control of internal circuits will be described in detail below, with references made to the drawings.

Figure 5:
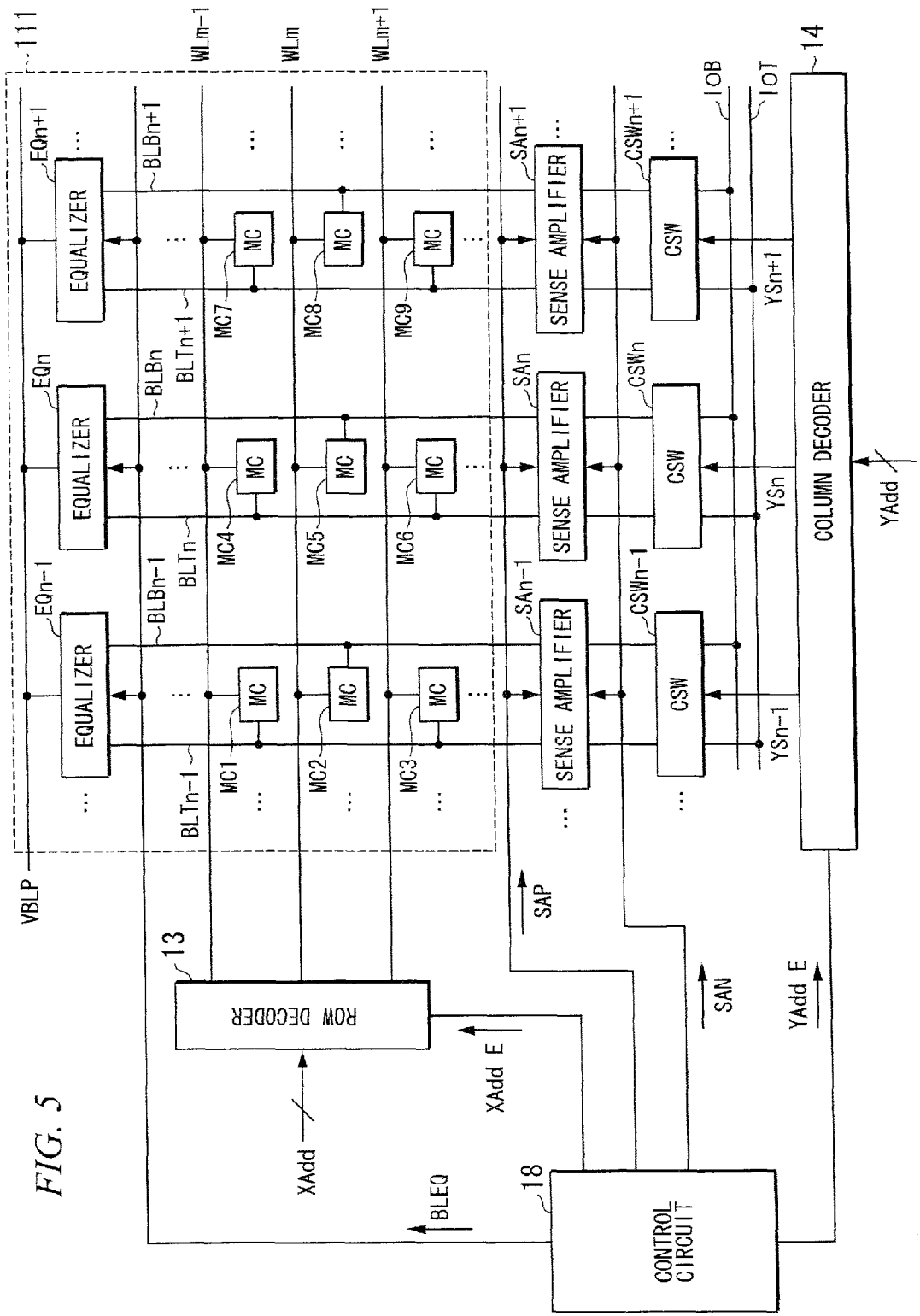
FIG. 5 is a circuit diagram associated with active operation and precharge operation of the semiconductor device of FIG. 4.
Figure 6:
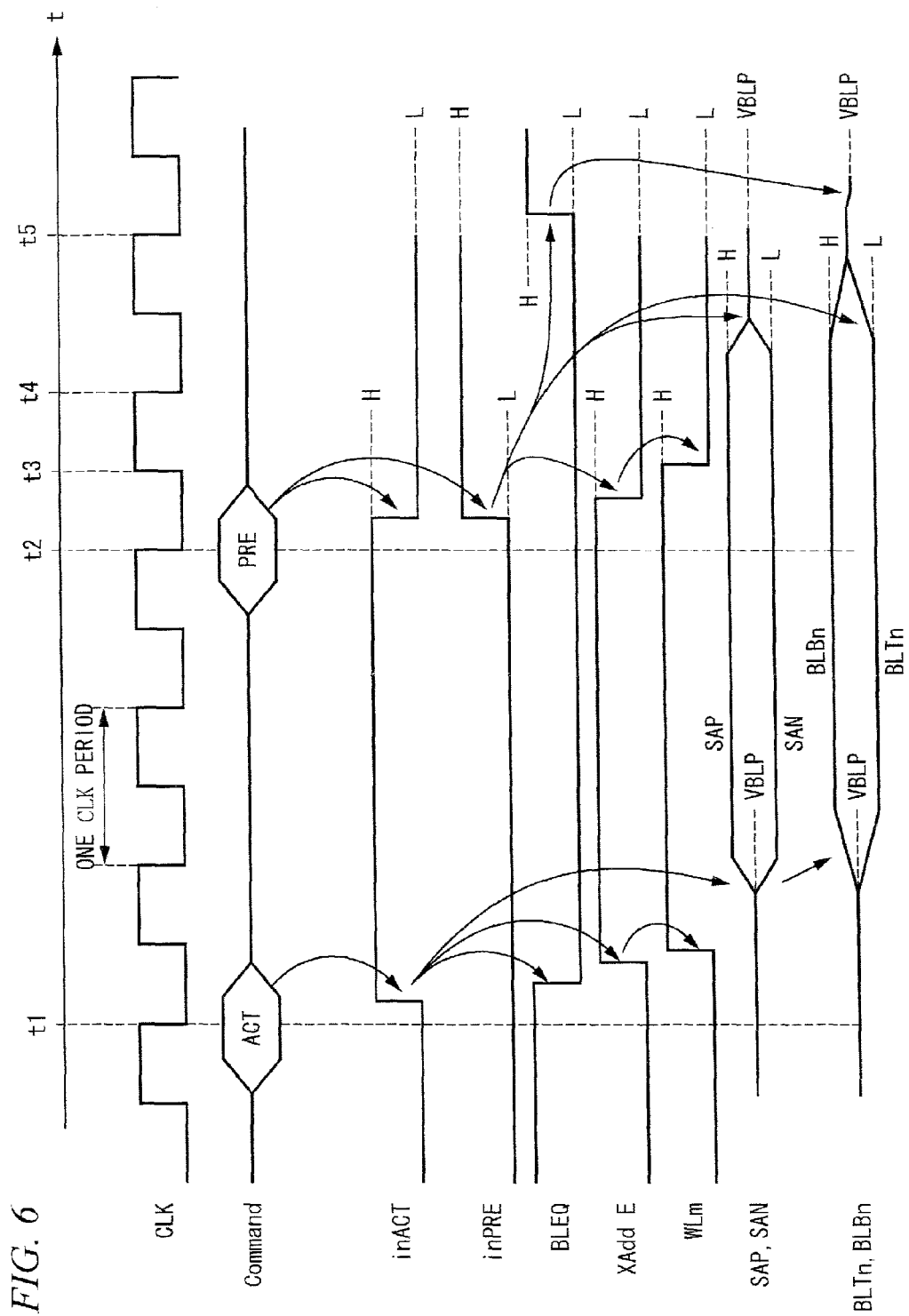
FIG. 6 is a timing chart of active operation and precharge operation of the semiconductor device of FIG. 4.

FIG. 5 is a circuit diagram for describing the operation of the memory cell array 111, and FIG. 6 is a timing diagram used to describe operation.

In FIG. 5, a plurality of memory cells are arranged, with each memory cell connected to a word line and a bit line. In FIG. 5, the plurality of memory cells are shown as 3×3=9 memory cells (memory cells MC1 to MC9). Three word lines (word lines WLm−1 to word line WLm+1 are shown as the word lines, and three pairs of bit lines (the bit line pair of bit line BLTn−1 and bit line BLBn−1, the bit line pair of bit line BLTn and bit line BLBn, and the bit line pair of bit line BLTn+1 and bit line BLBn+1) are shown as the bit lines. The arrangement of this cell array is a so-called folded-bit line arrangement, although an open bit line arrangement may also be used.

As shown in FIG. 5, each of the nine memory cells MC1 to MC9 is connected to one of the word lines WLm−1 to WLm+1 connected to the X decoder, and is connected to one of the bit lines of the three pairs of bit lines.

Each of the three bit line pairs is connected to one of the equalizer EQn−1 to equalizer EQn+1.

Each of the equalizer EQn−1 to equalizer EQn+1 is activated when the control signal BLEQ input from the control circuit 18 is at the active level (high level), the bit line pair provided in correspondence thereto being shorted, and the voltage level of each of the bit lines constituting the bit line pair being made a level that is equal to the voltage level of the bit line pre-charge voltage VBLP.

The bit line pre-charge voltage VBLP is generated by a voltage-dropping circuit provided within the semiconductor device 100, and is a voltage that is, for example, one-half of the voltage VDD at which the semiconductor device 100 operates.

Each of the equalizer EQn−1 to the equalizer EQn+1 is deactivated when the control signal BLEQ input from the control circuit 18 is at the inactive level (low level), thereby stopping the shorting of the bit line pair and floating each of the bit lines.

In FIG. 5, sense amplifier SAn−1 to sense amplifier SAn+1 are provided in correspondence with the three pairs of bit lines. The sense amplifier 15 shown in FIG. 1 is constituted by the disposing of a plurality of these sense amplifiers SA.

Each of the sense amplifier SAn−1 to sense amplifier SAn+1, after reading out the data from the memory cell to one of the bit lines of the corresponding bit line pair, amplifies the differential voltage across the bit line pair, amplifying the bit line pair in accordance with the memory cell data. For example, in the case in which the level stored in the memory cell corresponding to each of sense amplifier SAn−1 to SAn+1 is the low level, corresponding to the data 0, one of the bit lines of the bit line pair is amplified to the low level (ground level) and the other bit line of the bit line pair is amplified to the high level (VDD level). In the case in which the level stored in the memory cell corresponding to each of sense amplifier SAn−1 to SAn+1 is the high level, corresponding to the data 1, one of the bit lines of the bit line pair is amplified to the high level, and the other bit line of the bit line pair is amplified to the low level.

When an internal activate signal in ACT is input from the command decoder 16, the control circuit 18 changes the control signal SAP from the inactive level (voltage level of the bit line pre-charge voltage VBLP) to the active level (high level), and changes the control signal SAN from the inactive level (voltage level of the bit line pre-charge voltage VBLP) to the active level (low level). When the active level control signal SAP and control signal SAN are input, each of the sense amplifier SAn−1 to the sense amplifier SAn+1 starts the operation of amplifying the data stored in the corresponding memory cell.

When the internal pre-charge signal in PRE is input from the command decoder 16, the control circuit 18 changes the control signal SAP from the active level to the inactive level, and changes the control signal SAN from the active level to the inactive level. When the inactive level control signal SAP and inactive level control signal SAN are input, each of sense amplifier SAn−1 to sense amplifier SAn+1 stops the operation of amplifying the data stored in the corresponding memory cell.

In this manner, the control circuit 18, based on the internal activate signal in ACT and the internal pre-charge signal in PRE, causes transitions of the voltage levels of the control signal SAP and the control signal SAN, thereby controlling activation or deactivation of each of the sense amplifier SAn−1 to the sense amplifier SAn+1.

When the internal activate signal in ACT is input from the command decoder 16, the control circuit 18 changes the control signal BLEQ from the active level (high level) to the inactive level (low level), thereby deactivating the equalizer EQn−1 to the equalizer EQn+1. When the internal pre-charge signal in PRE is input from the command decoder 16, the control circuit 18 changes the control signal BLEQ from the inactive level (low level) to the active level (high level), thereby activating the equalizer EQn−1 to the equalizer EQn+1.

In this manner, the control circuit 18, based on the internal activate signal in ACT and the internal pre-charge signal in PRE, causes transitions of the voltage level of the control signal BLEQ, thereby controlling activation or deactivation of the equalizer EQn−1 to the equalizer EQn+1.

When the internal activate signal in ACT is input from the command decoder 16, the control circuit 18 changes the control signal XAddE from the inactive level (low level) to the active level (high level). When the active level control signal XAddE is input, the row decoder 13 decodes the internal address signal XAdd, selects a word line (makes it high level), and connects the memory cell connected to the word line to the corresponding bit line.

When the internal pre-charge signal in PRE is input from the command decoder 16, the control circuit 18 changes the control signal XAddE from the active level (high level) to the inactive level (low level). When the inactive level control signal XAddE is input, the row decoder 13 unselects a word line (makes it low level) and disconnects the memory cell connected to the word line from the corresponding bit line.

In this manner, the control circuit 18, based on the internal activate signal in ACT and the internal pre-charge signal in PRE, causes transitions of the voltage level of the control signal XAddE, thereby controlling activation or deactivation of the row decoder 13.

When the internal activate signal in ACT is input from the command decoder 16 followed by the input of the internal write signal or an internal read signal, the control circuit 18 outputs to the column decoder 14 an active level control signal YAddE that has its timing adjusted with respect to the timing of the transition of the control signal SAP and the control signal SAN to the active level. When the active level control signal YAddE is input, the column decoder 14 decodes the internal address signal YAdd and outputs one of the column switching signal YSn−1 to the column switching signal YSn+1. By doing this, one of the column switch CSWn−1 to the column switch CSWn+1 is selected, the selected column switch connecting the corresponding bit line pair with an I/O line pair (IOT and IOB).

In the case in which the READ command is input to the command decoder 16 of the semiconductor device 100 following the ACT command, that is, in the case in which an internal read signal is input to the control circuit 18, memory cell data that is amplified by a sense amplifier is input to the data input/output circuit 19 via the selected column switch and I/O line pair. The data input/output circuit 19 outputs the memory cell data to outside the semiconductor device 100.

In the case in which the WRITE command is input to the command decoder 16 of the semiconductor device 100 following the ACT command, that is, in the case in which an internal write signal is input to the control circuit 18, data from outside the semiconductor device 100 is written to a bit line by the data input/output circuit 19 via the an I/O line pair and the selected column switch. In this manner, the sense amplifier, along with the data input/output circuit 19, writes data from outside into the memory cell.

Next, the operation of the control circuit 18, in response to a logic level change in the internal ACT signal in ACT and the internal pre-charge signal in PRE, adjusting the timing of the above-noted control signals, and the operation of various circuits to which the control signals are input will be described, with reference made to FIG. 6.

The operation of the various circuits shown in FIG. 5 will be briefly described for the case of normal operation (in which the test mode is not set into MRW), which is different from test mode operation, in which the ACT command and the PRE related to the present invention are supplied from outside.

First, at time t1, at the falling edge of the clock signal CLK from outside, for example, when the external memory control signals CS and RAS are at the low level, and the external memory control signals CAS and WE are at the high level, the ACT command is input to the command decoder 16. When this occurs, of the internal command signals output by the command decoder 16, the internal activate signal in ACT changes from the low level to the high level. In response to this change of the internal activate signal changing to the high level, an activation operation is performed within the semiconductor device 100. That is, the control circuit 18 changes the control signal BLEQ from the active level (high level) to the inactive level (low level) and stops the bit line pre-charging operation, which is the activation operation of the equalizer EQ in the memory cell array 111.

Next, the control circuit 18 changes the control signal XAddE from the inactive level (low level) to the active level (high level), and causes the execution of the word line selection operation, which is the activation operation of the row decoder 13. By doing this, of the word lines shown in FIG. 5, the row decoder 13 changes, for example, the word line WLm to the high level. The memory cell MC2, the memory cell MC5, and the memory cell MC8 that are connected to the word line WLm are selected, and memory cell data is read out to the respective bit lines BLBn−1, BLBn, and BLBn+1. A differential voltage occurs across each of the bit line pairs.

Next, the control circuit 18 changes the control signal SAP from the inactive level (voltage level of the bit line pre-charge voltage VBLP) to the active level (high level), and changes the control signal SAN from the inactive level (voltage level of the bit line pre-charge voltage VBLP) to the active level (low level). By doing this, the active level control signals SAP and SAN are input to the each of the sense amplifier SAn−1 to the sense amplifier SAn+1, and the operation of amplifying the corresponding bit line pair is started. FIG. 6 shows the case in which, of the selected memory cells, the memory cell MC5 stores the high level, the bit line BLBn being amplified to the high level, and the bit line BLBn being amplified to the low level. Of course, accompanying this amplifying operation, the data stored by the memory cell MC5 is refreshed to the high level.

Next, if the READ command is input between time t1 and time t2, the data stored by the memory cell is output to the outside of the semiconductor device 100. Alternatively, if the WRITE command is input between time t1 and time t2, data is input from the outside of the semiconductor device 100. In this case, if neither operation is performed, that is, in the case in which a refresh operation is to be performed in the execution of which the row address is specified, the PRE command is supplied to the semiconductor device 100 at time t2.

First, at time t2, when transitioning to the standby state, at the rising edge of the clock signal CLK, if the external memory control signals CS, RAS, and WE are at the low level, and the external memory control signal CAS is at the high level, the PRE command is input to the command decoder 16.

When this occurs, of the internal command signals that are output by the command decoder 16, the internal pre-charge signal in PRE changes from the low level to the high level. In response to the internal pre-charge signal in PRE changing to the high level, a pre-charge operation is performed internally in the semiconductor device 100.

The control circuit 18 changes the control signal XAddE from the active level (high level) to the inactive level (low level), thereby stopping the operation of the row decoder 13 selecting a word line. When the inactive level control signal XAddE is input, the row decoder 13 changes the selected word line (in this case, the word line WLm) to the low level.

By doing this, the memory cell MC2, the memory cell MC5, and the MC8 are disconnected, respectively, from the bit line BLBn−1, the bit line BLBn, and the bit line BLBn+1, and store data after refreshing.

Next, the control circuit 18 changes the control signal SAP from the active level (high level) to the inactive level (the voltage level of the bit line pre-charge voltage VBLP), and changes the control signal SAN from the active level (low level) to the inactive level (the voltage level of the bit line pre-charge voltage VBLP). By doing this, the sense amplifier ends the amplification operation.

Next, the control circuit 18 changes the control signal BLEQ from the inactive level (low level) to the active level (high level), thereby starting the pre-charge operation, which is the operation of activating the bit line of the equalizer EQ. The voltage on the bit line pair is pre-charged to the voltage level of the bit line pre-charge voltage VBLP (that is, becomes the voltage level in the standby state).

As described above, the command decoder 16, in synchronization with the falling edge of the clock signal CLK, captures the ACT command and changes the internal activate command in ACT from the low level to the high level. Then, as described above, the control circuit 18 generates the control signal BLEQ, the control signal XAddE, the control signal SAP, and the control signal SAN, the timings of which are adjusted to the rising edge of the internal activate signal in ACT, thereby causing deactivation of the equalizer EQ, activation of the row decoder 13, and activation of the sense amplifier.

The command decoder 16, in synchronization with the falling edge of the clock signal CLK, captures the PRE command and changes the internal pre-charge signal in PRE from the low level to the high level. Then, the control circuit 18, as described above, generates the control signal BLEQ, the control signal XAddE, the control signal SAP, and the control signal SAN, the timings of which are adjusted to the rising edge of the internal pre-charge signal in PRE, thereby causing the activation of the equalizer EQ, the deactivation of the row decoder 13, and the deactivation of the sense amplifier.

Consider the case in which the ACT command is supplied to the semiconductor device 100, following the PRE command.

Because the input timing of each of the commands is at the falling edge of the clock signal CLK, in the case of a tRP test of the semiconductor device 100, the tRP time is tested by an integral multiple of one period of the clock signal CLK.

For example, in the case in which a high-frequency clock signal CLK is supplied and a performance limit test of the tRP time is performed, an ACT command is input at time t4 or time t5 or the like as shown in FIG. 6. For example, by supplying the ACT command at time t5, the word line is selected in a condition in which the bit line voltage has not been sufficiently pre-charged to the initial value of voltage level (the voltage level of the bit line pre-charge voltage VBLP), so that the operation of amplification by the sense amplifier starts in a condition in which the memory cell data cannot be sufficiently read out to the bit line, and erroneous read-out of data can be envisioned.

Alternatively, in the case in which the same high-frequency clock signal as noted above is supplied at time t4, and a higher-frequency clock signal CLK is supplied at time t5, the next word line is selected in a condition in which the word line reset (rest to the low level) is insufficient, thereby destroying the data of the previously selected word line, and it can be envisioned that the next data read out is erroneous data by accessing the destroyed memory cell.

It is possible to determine whether erroneous data will be read out in this manner by testing the performance limit of the tRP time, by supplying the PRE command (at time t2), followed by supplying the ACT command at a time that is varied (a timing that is delayed from the time t2 by an integral multiple of one period of the clock signal CLK), making this judgment by the tester.

For example, in FIG. 6, in the case in which erroneous data read-out results if the ACT command is supplied at time t4 and correct read-out results if the ACT command is supplied at time t5, the performance limit of the tRP of the semiconductor device 100 can be judged by the tester to be between (t4−t2) and (t5−t2).

However, in the case of a tester only capable of supplying a low-frequency clock signal, even if an ACT command is supplied at time t4, which is the time of the next falling edge of the clock signal CLK following the time t2, it is possible that an erroneous data read-out operation does not occur. That is, the semiconductor device 100 starts the pre-charge operation from the time t2 and by its own capability, without regard to the period of the clock signal, completes the pre-charge of the above-noted bit line. For this reason, in the case in which a low-frequency clock signal is supplied and the pre-charge operation in the semiconductor device 100 is completed, even if the ACT command is supplied at the time t4, it is possible that the above-described erroneous data read-out operation does not occur. That is, the tRP performance limit of the semiconductor device, in the case in which the clock signal is of low frequency, is less than (t4−t2), so that it becomes impossible to determine the tRP performance limit of the semiconductor device 100.

Given the above, in the semiconductor device 100 of the present embodiment, by adopting the constitution described below for the command decoder 16, even in the case in which, in the test mode, the PRE command is supplied at the time t2 and the ACT command is supplied at the time t4 shown in FIG. 6, the internal pre-charge signal in PRE is substantially delayed by an amount of time that is the same as in the case in which the PRE command is supplied at time t3. By doing this, it becomes possible to execute the pre-charge operation of the semiconductor device 100 in one-half of the period of the clock signal CLK, thereby enabling a tRP performance limit test of the semiconductor device 100 even with a tester that can only supply a low-frequency clock signal.

Furthermore, to transition the semiconductor device 100 to the test mode, with the external memory control signals CS, RAS, WE, and CAS all at the low level at the rising edge of the clock signal CLK, the MRW command is supplied to the command decoder 16. In the case in which the MRW command is input and the logic of the input command address signal CA is of a prescribed logic, the mode register 17 generates the test mode signal TEST, which indicates the transition of the semiconductor device 100 to the test operating mode. The test mode signal TEST is input to the command decoder 16, and is used to connect the switch SW3 of the command decoder to the test mode side.

Furthermore, after the MRW command is supplied to the semiconductor device 100 and a transition is made to the above-noted test operating mode, if the ACT command and READ command or the like are supplied, the semiconductor device 100 performs the above-noted operation instructed by the supplied commands.

The test mode signal TEST holds the condition in which the switch SW3 is in the test operating mode state (test mode set state) until the MRW command is supplied again.

In the case in which the semiconductor device 100 transitions from the test operating mode to the normal operating mode, the logic of the MRW command that is again supplied and of the command address signal CA that is input release the mode register 17 and set the normal operating mode.

Next, the constitution of the command decoder 16 will be described, using the drawings.

Figure 7:
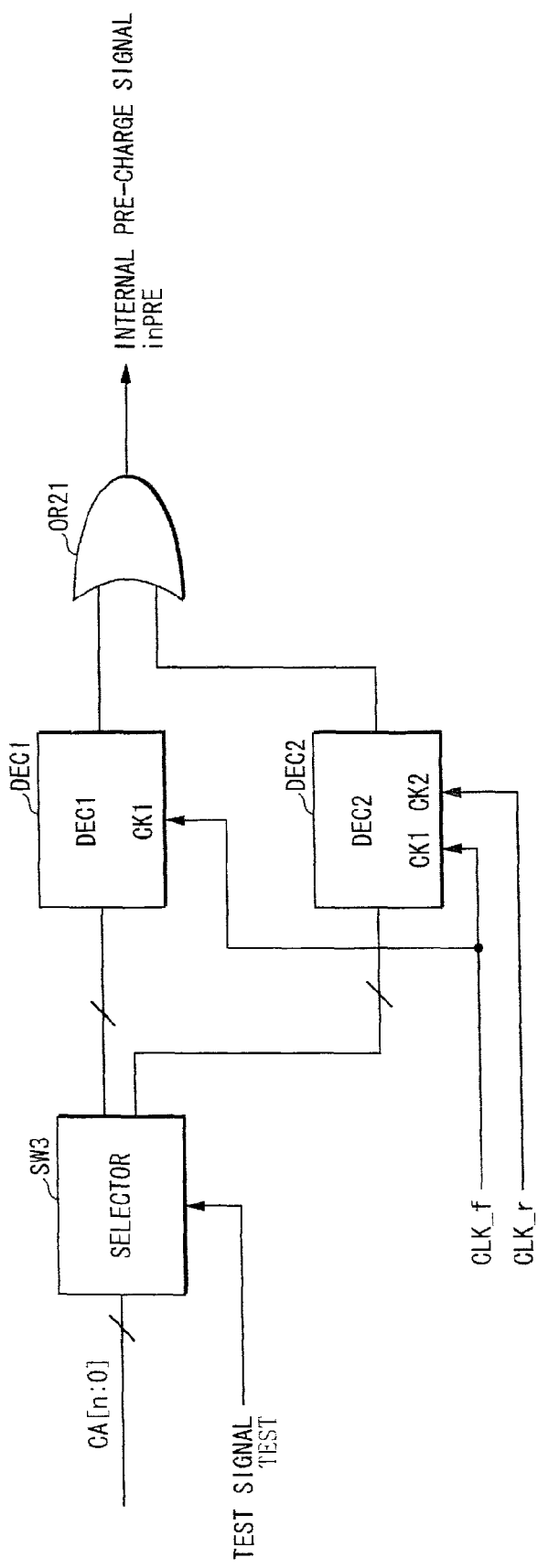
FIG. 7 is a block diagram of a configuration of the command decoder of FIGS. 1 and 4.
Figure 11:
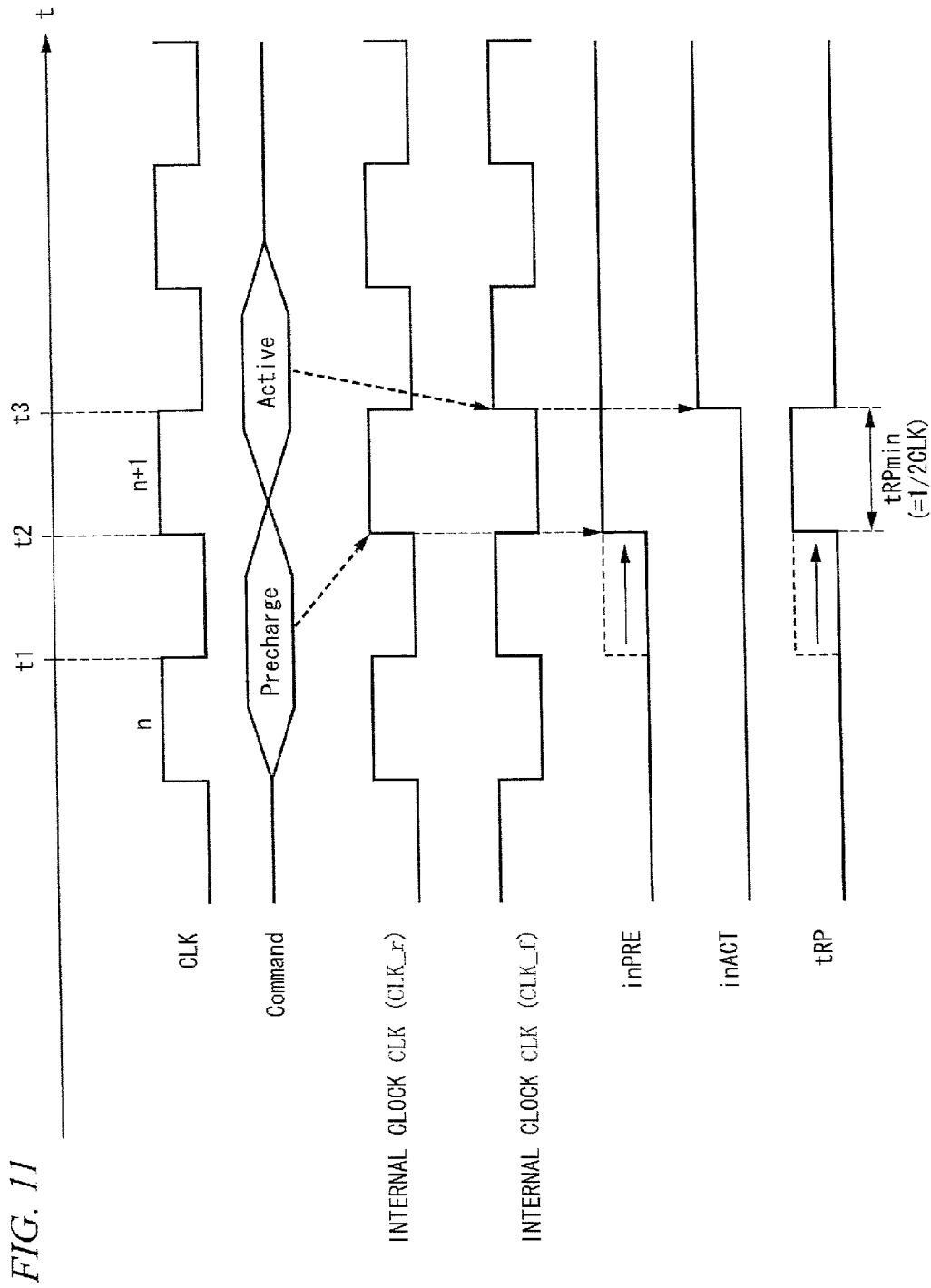
FIG. 11 is a timing chart of a command decoder in FIG. 4.

FIG. 7 is a block diagram of the part related to the precharge operation of the command decoder 16 shown in FIG. 4. FIG. 8 is a logic-level circuit diagram and a gate-level circuit diagram of the switch SW3 shown in FIG. 7. FIG. 9 is a gate-level circuit diagram of the decoder DEC 1 and a gate-level circuit diagram of the decoder DEC2 shown in FIG. 7, and FIG. 10 is a transistor-level circuit diagram of the latch LTH1 and a transistor-level circuit diagram of a latch LTH2 shown in FIG. 9. Of the circuit symbols used in FIG. 10, the reference symbol QP indicates a PMOS transistor (p-channel MOS transistor) and the reference symbol QN indicates an NMOS transistor (n-channel MOS transistor). FIG. 11 is an operational timing diagram of the command decoder 16 shown in FIG. 4.

The constitution of the command decoder 16 shown in FIG. 7 will be described below, with references made to FIG. 8 to FIG. 10.

As shown in FIG. 7, the command decoder 16 is constituted by the switch SW3, the decoder DEC1, the decoder DEC2, and the OR circuit OR21.

Figure 8A:
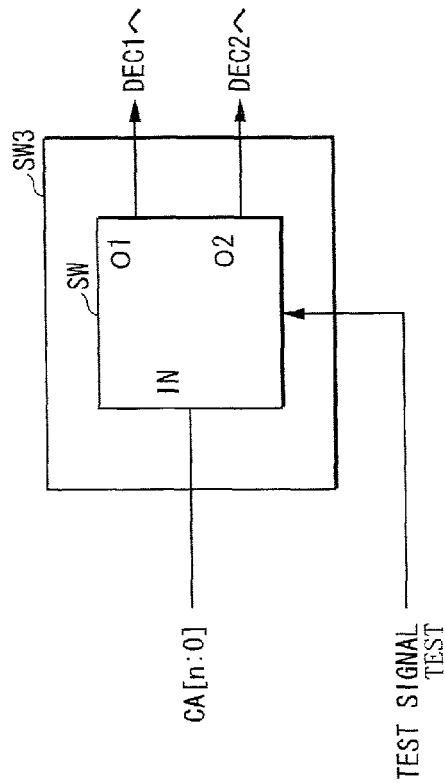
FIGS. 8A and 8B are logic circuit diagrams of a selector in FIG. 7.

The switch SW3, as shown in FIG. 8A, is a circuit that, by the logic of the test mode signal TEST, supplies the command address signal CA input to the command decoder 16 to one of the decoder DEC1 and the decoder DEC2. In FIG. 8A, the switch SW3 has a terminal IN, a terminal O1, and a terminal O2 and, in normal operation, the command address signal CA [n:0] input to the terminal IN is output to the decoder DEC1 from the terminal O1. In contrast, in test mode operation, the switch SW3 outputs the command address CA signal [n:0] input to the terminal IN to the decoder DEC2 from the terminal O2.

Figure 8B:
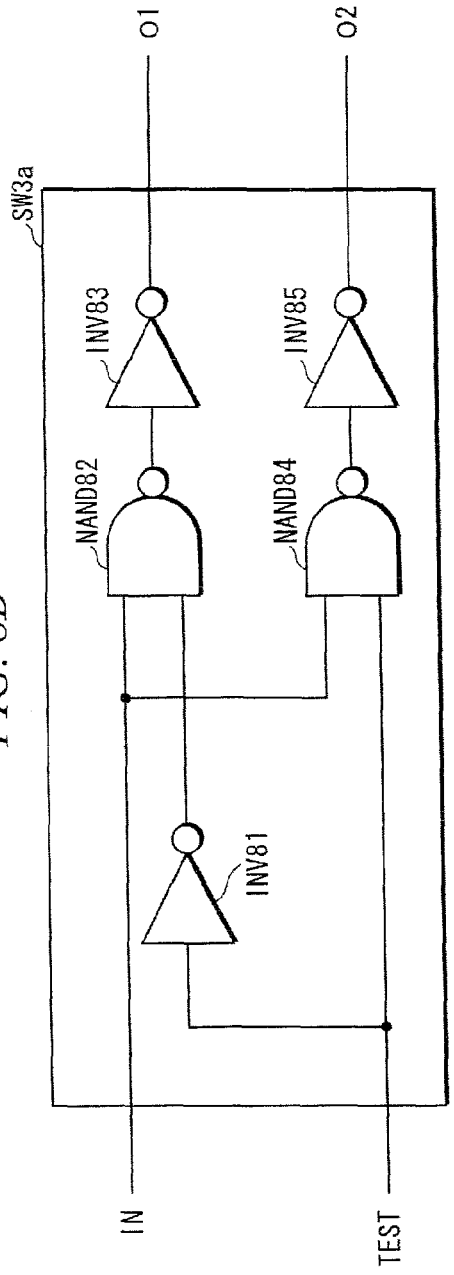

The switch SW3 has a plurality (n+1) of the switches SW3a shown in FIG. 8B. One bit of the command address signal CA [n:0] is input to the terminal IN shown in FIG. 8B. The switch SW3a has an inverter circuit INV81, a NAND circuit NAND82, an inverter circuit INV83, a NAND circuit NAND84, and an inverter circuit INV85.

The inverter circuit INV81 logically inverts the test mode signal TEST and outputs it to the NAND circuit NAND82.

The NAND circuit NAND82 inputs one command address signal of the command address signal CA [n:0] and the output signal from the inverter circuit INV81. In the inverter circuit INV83 logically inverts the output of the NAND circuit NAND82 and outputs the result from the terminal O1.

The NAND circuit NAND84 inputs one command address signal of the command address signal CA [n:0] and the test mode signal TEST. The inverter circuit INV85 logically inverts the output of the NAND circuit NAND84 and outputs the result from the terminal O2.

By the above-noted constitution, when the test mode signal TEST is at the low level, the switch SW3a outputs a signal having the same logic level as the command address signal CA from the terminal O1, and when the test mode signal TEST is at the high level, the switch SW3a outputs a signal having the same logic level as the command address signal CA from the terminal O2.

Returning to FIG. 7, when the test mode signal TEST is at the low level (during normal operation, when the test mode signal is at the first logic level), the switch SW3 (switch) outputs a signal that is the same logic level as the command address signal CA [n:0] to the decoder DEC1, and when the test mode signal TEST is at the high level (during test mode operation, when the test mode signal is at the second logic level), the switch SW3 outputs a signal that is the same logic level as the command address signal CA [n:0] to the decoder DEC2.

As shown in FIG. 9A, the decoder DEC 1 shown in FIG. 7 is constituted by an AND circuit AND91 (second recognizing unit), a latch LTH1 (second latch), and an AND circuit AND11.

As shown in the circuit constitution of FIG. 10A, the latch LTH1 is constituted by a transistor QN101, a transistor QP102, a transistor QP103, a transistor QN104, an inverter circuit INV101, an inverter circuit INV102, an inverter circuit INV103, an inverter circuit INV104 and an inverter circuit INV105.

The input of the inverter circuit INV101 is connected to the terminal at which the clock CK is input, and the output thereof is connected to the input of the inverter circuit INV102, the gate terminal of the transistor QN101, and the gate terminal of the transistor QP103.

The inverter circuit INV101 logically inverts the signal of the clock CK and outputs the logically inverted signal to the input of the inverter circuit INV102, to the gate terminal of the transistor QN101 and to the gate terminal of the transistor QP103.

The input of the inverter circuit INV102 is connected to the output of the inverter circuit INV101, the output is connected to the gate terminal of the transistor QP102 and to the gate terminal of the transistor QN104.

The inverter circuit INV102 logically inverts the output of the inverter circuit INV101 and outputs the logically inverted signal to the gate terminal of the transistor QP102 and to the gate terminal of the transistor QN104.

The source terminal and the drain terminal are commonly connected between the transistor QN101 and the transistor QP102 so as to constitute a transfer gate. The source terminals of the transistor QN101 and the transistor QP102 are connected to a D terminal that is a data input terminal of the latch LTH1. The drain terminals of the transistor QN101 and the transistor QP102 are connected to the source terminals of the transistor QP103 and the transistor QN104 and to the input of the inverter circuit INV103.

The transistor QN101 and the transistor QP102 output to their drain terminals the data that is input to the D terminal connected to the source terminals thereof, during the time when the clock CK is at the low level. When the clock CK transitions from the low level to the high level, the transistor QN101 and the transistor QP102 do not accept the data input to the source terminal and stop the output to their drain terminals.

The sources and the drains of the transistor QP103 and the transistor QN104 are connected in common so as to constitute a transfer gate. The source terminals of the transistor QP103 and the transistor QN104 are connected to the drain terminals of the transistor QN101 and the transistor QP102 and to the input of the inverter circuit INV103. The drain terminals of the transistor QP103 and the transistor QN104 are connected to the output of an inverter circuit INV104.

The input of the inverter circuit INV103 is connected to the drain terminals of the transistor QN101 and the transistor QP102, and the output thereof is connected to the input of the inverter circuit INV104 and to the input of an inverter circuit INV105.

The input of the inverter circuit INV104 is connected to the output of the inverter circuit INV103 and to the input of the inverter circuit INV105. The output of the inverter circuit INV104 is connected to the drain terminals of the transistor QP103 and the transistor QN104.

The input of the inverter circuit INV105 is connected to the output of the inverter circuit INV103 and to the input of the inverter circuit INV104. The output of the inverter circuit INV105 is connected to a Q terminal, which is the data output terminal of the latch LTH1.

When the clock CK is at the low level, the inverter circuit INV103 and the inverter circuit INV105 output from the data output terminal Q a signal having the same logic level as the data input to the data input terminal D.

The inverter circuit INV103, the inverter circuit INV104, the transistor QP103, and the transistor QN104 constitute a flip-flop that, during the high level of the clock CK when the clock CK transitions from the low level to the high level, holds data captured from the D terminal into the latch LTH1. The inverter circuit INV103 and the inverter circuit INV105 output this captured data from the Q terminal.

By the above constitution, because the transistors QN101 and QP102 switch on during the low level of the clock CK, the latch LTH1 receives the data input from the D terminal and outputs a data of the same logic level from the Q terminal. At the rising edge of the clock CK, the transistors QN101 and QP102 switch off, and the data input from the D terminal is latched in the flip-flop circuit of the inverter circuit INV103, the inverter circuit INV104, the transistor QP103, and the transistor QN104 latches (that is, the data is fixed and held), the latched data being output from the Q terminal.

Returning to FIG. 9A, by the AND circuit AND91 (second recognizing unit), the decoder DEC 1 recognizes that the PRE command is supplied, when all of the command address signals CA [n:0] are at the high level. The decoder DEC1 captures the command into the latch LTH1 (second latch) during the low level of the internal clock signal CLK_f, and holds the command at the rising edge of the clock signal CLK_f. At the same rising edge of the internal clock signal CLK_f, the decoder DEC1 outputs an OUT1 signal of the same logic level as data at the high level, which is the recognizing results (that is, the output of the AND circuit AND91), from the AND circuit AND11.

The decoder DEC2 in FIG. 7, as shown in FIG. 9B, is constituted by an AND circuit AND93 (third recognizing unit), a latch LTH2 (third latch), the latch LTH1 (second latch), and the AND circuit AND21.

The latch LTH2 is, as shown the circuit constitution in FIG. 10B, constituted by a transistor QN111, a transistor QP112, a transistor QP113, a transistor QN114, an inverter circuit INV111, an inverter circuit INV112, an inverter circuit INV113, an inverter circuit INV114 and an inverter circuit INV115.

Additionally, the latch LTH2 is constituted by a transistor QN121, a transistor QP122, a transistor QP123, a transistor QN124, an inverter circuit INV122, an inverter circuit INV123, an inverter circuit INV124, and an inverter circuit INV125.

The input of the inverter circuit INV111 is connected to the terminal at which the clock CK is input, and the output thereof is connected to the input of the inverter circuit INV112 and to the gate terminal of the transistor QN111.

The inverter circuit INV111 logically inverts the clock CK, and outputs the logically inverted signal to the gate terminal of the transistor QN111, to the gate terminal of the transistor QP113 and to the input of the inverter circuit INV112.

The input of the inverter circuit INV112 is connected to the output of the inverter circuit INV111, and the output thereof is connected to the gate terminal of the transistor QP112, to the gate terminal of the transistor QN114, to the gate terminal of the transistor QN121, and to the input of the inverter circuit INV122.

The inverter circuit INV112 logically inverts the output of the inverter circuit INV111, and outputs the logically inverted signal to the gate terminal of the transistor QP112, to the gate terminal of the transistor QN114, to the gate terminal of the transistor QN121 and to the input of the inverter circuit INV122.

The source terminal and the drain terminal are commonly connected between the transistor QN111 and the transistor QP112 so as to constitute a transfer gate. The source terminals of the transistor QN111 and the transistor QP112 are connected to a D terminal that is a data input terminal of the latch LTH2. The drain terminals of the transistor QN111 and the transistor QP112 are connected to the source terminals of the transistor QP113 and the transistor QN114 and to the input of an inverter circuit INV113.

The transistor QN111 and the transistor QP112 output to their drain terminals the data that is input to the D terminal connected to the source terminals thereof, during the time when the clock CK is at the low level. When the clock CK transitions from the low level to the high level, the transistor QN111 and the transistor QP112 do not accept the data input to the source terminal and stop the output to their drain terminals.

The sources and the drains of the transistor QP113 and the transistor QN114 are connected in common so as to constitute a transfer gate. The source terminals of the transistor QP113 and the transistor QN114 are connected to the drain terminals of the transistor QN111 and the transistor QP112 and to the input of an inverter circuit INV113. The drain terminals of the transistor QP113 and the transistor QN114 are connected to the output of an inverter circuit INV114.

The input of the inverter circuit INV113 is connected to the drain terminal of the transistor QN111 and the transistor QP112, and the output thereof is connected to the input of the inverter circuit INV114 and to the input of an inverter circuit INV115.

The input of the inverter circuit INV114 is connected to the output of the inverter circuit INV113 and to the input of the inverter circuit INV115. The output of the inverter circuit INV114 is connected to the drain terminals of the transistor QP113 and the transistor QN114.

The input of the inverter circuit INV115 is connected to the output of the inverter circuit INV113 and to the input of the inverter circuit INV114. The output of the inverter circuit INV115 is connected to the source terminals of the transistor QN121 and the transistor QP122.

When the clock CK is at the low level, the inverter circuit INV113 and the inverter circuit INV115 output to the source terminals of the transistor QN121 and the transistor QP122 a signal having the same logic level as the data input to the data input terminal D.

The inverter circuit INV113, the inverter circuit INV114, the transistor QP113, and the transistor QN114 constitute a flip-flop that, during the high level of the clock CK when the clock CK transitions from the low level to the high level, holds data captured from the D terminal into the latch LTH2. The inverter circuit INV113 and the inverter circuit INV115 output this captured data to the source terminals of the transistor QN121 and the transistor QP122.

The input of the inverter circuit INV122 is connected to the output of the inverter circuit INV112, and the output thereof is connected to the gate terminal of the transistor QP122 and to the gate terminal of the transistor QN124.

The inverter circuit INV122 logically inverts the output of the inverter circuit INV112, and output the logically inverted signal to the gate terminal of the transistor QP122 and to the gate terminal of the transistor QN124.

The source terminal and the drain terminal are commonly connected between the transistor QN121 and the transistor QP122 so as to constitute a transfer gate. The source terminals of the transistor QN121 and the transistor QP122 are connected to the output of the inverter circuit INV115. The drain terminals of the transistor QN121 and the transistor QP122 are connected to the source terminals of the transistor QP123 and the transistor QN124 and to the input of the inverter circuit INV123.

The transistor QN121 and the transistor QP122 output of the inverter circuit INV115 connected to the source terminal to the drain terminal during the high level of the clock CK. When the clock CK transitions from the high level to the low level, the transistor QN121 and the transistor QP122 do not accept the data input to the source terminal and stop the output to their drain terminals.

The source and the drain are commonly connected between the transistor QP123 and the transistor QN124 so as to constitute a transfer gate. The source terminals of the transistor QP123 and the transistor QN124 are connected to the drain terminals of the transistor QN121 and the transistor QP122 and to the input of the inverter circuit INV123. The drain terminals of the transistor QP123 and the transistor QN124 are connected to the output of the inverter circuit INV124.

The input of the inverter circuit INV123 is connected to the drain terminals of the transistor QN121 and the transistor QP122, and the output thereof is connected to the input of the inverter circuit INV124 and to the input of an inverter circuit INV125.

The input of the inverter circuit INV124 is connected to the output of the inverter circuit INV123 and to the input of the inverter circuit INV125. The output of the inverter circuit INV124 is connected to the drain terminals of the transistor QP123 and the transistor QN124.

The input of the inverter circuit INV125 is connected to the output of the inverter circuit INV123 and to the input of the inverter circuit INV124. The output of the inverter circuit INV125 is connected to a Q terminal, which is a data output terminal of the latch LTH2.

When the clock CK is at the high level, the inverter circuit INV123 and the inverter circuit INV125 output from the data output terminal Q a signal having the same logic level as the output of the inverter circuit INV115.

The inverter circuit INV123, the inverter circuit INV124, the transistor QP123, and the transistor QN124 constitute a flip-flop that, during the low level of the clock, CK when the clock CK transitions from the high level to the low level, holds data captured from the D terminal into the latch LTH2. The inverter circuit INV123 and the inverter circuit INV125 output this captured data from the Q terminal.

By the above constitution, because the transistors QN111 and QP112 switch on during the low level of the clock CK, the latch LTH2 receives from the inverter circuit INV115 the data that is input at the D terminal and outputs data of the same logic level as the data input from the Q terminal. Because the transistors QN111 and QP112 switch off at the rising edge of the clock CK, the latch LTH2 latches the data input at the D terminal of the flip-flop circuit constituted by the inverter circuit INV113, the inverter circuit INV114, the transistor QP113, and the transistor QN114 (that is, the data is fixed and held). The latch LTH2 outputs from the Q terminal the data latched when the transistors QN121 and QP122 switch on at the same rising edge of the clock CK.

The latch LTH1 in the decoder DEC2 is a circuit in which the circuit structure is described using FIG. 10A. Because the transistors QN101 and QP102 switch on during the low level of the clock CK, the latch LTH1 receives data input at the Q terminal of the latch LTH2 and outputs data of the same logic level from its own Q terminal. At the rising edge of the clock CK, the transistors QN101 and QP102 switch off, and the data input at the D terminal of the latch LTH1 is latched into the flip-flop circuit constituted by the inverter circuit INV103, the inverter circuit INV104, the transistor QP103, and the transistor QN104 (that is, the data is fixed and held).

Returning to FIG. 9B, by the AND circuit AND93 (third recognizing unit) the decoder DEC2 recognizes that the PRE command is supplied, when all of the command address signals CA [n:0] are at the high level.

The decoder DEC2 captures the command into the latch LTH2 (third latch) during the low level of the internal clock signal CLK_f, and holds the command at the rising edge of the clock signal CLK_f.

At the same rising edge of the internal clock signal CLK_f, the decoder DEC2 outputs to the latch LTH1, a signal of the same logic level as data at the high level, which is the recognizing results (that is, an output of the AND circuit AND93), from the Q terminal of the latch LTH2.

Also, because the internal clock signal CLK_r becomes low level at this time, the decoder DEC2 captures the output of the latch LTH2 into the latch LTH1 during this low level.

The decoder DEC2 holds the output of the latch LTH1 at the next rising edge of the internal clock signal CLK_r. At the same rising edge of the internal clock signal CLK_r, the decoder DEC2 outputs an OUT2 signal of the same logic level as data at the high level, which is the recognizing results (that is, the output of the AND circuit AND93 and the output of the latch LTH2), from the AND circuit AND21.

Returning to FIG. 7, the operation in the case in which the PRE command is supplied to the command decoder 16 will be described, using FIG. 11.

FIG. 11 shows the waveforms, such as the output signal from the command decoder 16 (the internal activate signal in ACT and the internal pre-charge signal in PRE) when the PRE command is supplied to the semiconductor device 100 at the n-th falling edge of the clock signal CLK, and the ACT command is supplied to the semiconductor device 100 at the (n+1)th falling edge of the clock signal CLK.

In the usual normal operation, when the PRE command is supplied at the time t1, the command decoder 16, because the test mode signal TEST input to the internal switch SW3 is at the low level, outputs the supplied PRE command to the decoder DEC1. As described above, the decoder DEC1 outputs the internal pre-charge signal in PRE (the broken line in FIG. 1) at the rising edge of the internal clock signal CLK_f. When the ACT command is supplied at the time t3, which is the next falling edge of the clock signal CLK, the command decoder 16 outputs the internal activate signal in ACT at the rising edge of the internal clock signal CLK_f.

Therefore, in the usual normal operation, the time from the time of the output by the command decoder 16 of the internal pre-charge signal in PRE (time t1) until the time of the output of the internal activate signal in ACT (time t3) corresponds to one period of the clock signal CLK.

That is, in the usual normal operation, in the semiconductor device 100, the minimum time tRPmin of the tRP time in which a pre-charge operation is performed is the time of one period of the clock signal CLK.

In contrast, in test mode operation, when the PRE command is supplied at the time t1, because the test mode signal TEST input to the internal switch SW3 is at the high level, the command decoder 16 outputs the supplied PRE command to the decoder DEC2. As described above, the decoder DEC2 outputs the internal pre-charge signal in PRE at the rising edge of the internal clock signal CLK_r. That is, the command decoder 16, as shown by the solid line in FIG. 1, delays the internal pre-charge signal in PRE by ½ of the period of the clock signal CLK with respect to the internal pre-charge signal in PRE in the usual normal operation as shown by the broken line in FIG. 1 and outputs the delayed signal. When the ACT command is supplied at the time t3, which is the next falling edge of the clock signal CLK, the command decoder 16, similar to the case of the usual normal operation, outputs the internal activate signal in ACT at the rising edge of the internal clock signal CLK_f.

Therefore, in test mode operation, the time from the time of the output by the command decoder 16 of the internal pre-charge signal in PRE (time t2) until the time of the output of the internal activate signal in ACT (time t3) corresponds to ½ of the period of the clock signal CLK.

That is, in test mode operation, in the semiconductor device 100, the minimum time tRPmin of the tRP time in which a pre-charge operation is performed is the time of ½ of the period of the clock signal CLK, this being one-half of the time of the usual normal operation.

As described above, using FIG. 5 and FIG. 6, after supplying a low-frequency clock signal CLK and an a PRE command, if the ACT command is supplied after one period of the clock signal CLK, there are cases in which erroneous data is not read out, or erroneous data is not written into a memory cell, after which correct data is read out in a subsequent read-out operation.

Even in such cases, by delaying the internal pre-charge signal in PRE, substantially the same effect can be achieved as if the time at which the PRE command is supplied is delayed up to ½ period of the clock signal CLK before the time of supplying the ACT command, with erroneous data being read out or erroneous data being written into a memory cell, and it is possible to have erroneous data read out at a subsequent read-out operation.

That is, in the test mode operation, after supplying the PRE command, by supplying the ACT command before completing the pre-charge operation within the semiconductor device 100, an activation operation can start.

According to the semiconductor device 100, therefore, in the case of using a tester that can only supply a clock signal that is lower in frequency than the operating frequency of the semiconductor device, it is possible to shorten the tRP time to one-half of the performance limit of the tester, this achieving the effect of facilitating measurement of the performance limit of a synchronized semiconductor device that operates at a high speed.

The technical concept of the present application can be applied to semiconductor devices having various functions other than a memory function. Additionally, the form of the internal circuits of each of the blocks disclosed in drawings and the circuit that generates the other control signals are not restricted to the form of circuits disclosed by the embodiment.

The technical concept of the semiconductor device of the present invention can also be applied to various semiconductor devices. For example, the present invention can be applied general types of semiconductor devices, such as CPU (central processing unit), an MCU (micro-control unit), a DSP (digital signal processor), an ASIC (application-specific integrated circuit), an ASSP (application-specific standard product) and a memory. Types of semiconductor device products to which the present invention is applied that can be cited include an SOC (system-on-chip), an MCP (microchip package) and a POP (package-on-package) and the like. The present invention can be applied to a semiconductor device having these arbitrary product types and package types.

Also, the transistors may be field effect transistors (FETs), in addition to MOS (metal oxide semiconductor) transistors, various types of FETs, such as an MIS (metal-insulator semiconductor) or a TFT (thin-film transistor), can be applied. Moreover, it may be possible to partially use bipolar transistors within the device.

Additionally, an NMOS transistor (n-channel MOS transistor) is a typical example of a transistor of the first type of conductivity, and a PMOS transistor (p-channel MOS transistor) is a typical example of a transistor of the second type of conductivity.

The term "configured" is used to describe a component, section or part of a device includes hardware and/or software that is constructed and/or programmed to carry out the desired function.

The embodiments of methods, software, firmware or codes described above may be implemented by instructions or codes stored on a machine-accessible or machine readable medium. The instructions or codes are executable by a processing element or processing unit. The machine-accessible/readable medium may include, but is not limited to, any mechanisms that provide, store and/or transmit information in a form readable by a machine, such as a computer or electronic system. In some cases, the machine-accessible/readable medium may include, but is not limited to, random-access memories (RAMs), such as static RAM (SRAM) or dynamic RAM (DRAM), read-only memory (ROM), magnetic or optical storage medium and flash memory devices. In other cases, the machine-accessible/readable medium may include, but is not limited to, any mechanism that receives, copies, stores, transmits, or otherwise manipulates electrical, optical, acoustical or other form of propagated signals such as carrier waves, infrared signals, digital signals, including the embodiments of methods, software, firmware or code set forth above.

Furthermore, the particular features, structures, or characteristics may be combined in any suitable manner in one or more embodiments.

It is apparent that the present invention is not limited to the above embodiments, but may be modified and changed without departing from the scope and spirit of the invention.

What is claimed is:

1. A device comprising:
   a command decoder configured to output, in a normal operation mode, a precharge signal in response to a first type transition edge of a synchronous signal, and an active signal in response to a next first type transition edge that is next to the first type transition edge, and
   the command decoder configured to output, in a test mode, the precharge signal in response to a second type transition edge of the synchronous signal, and the active signal in response to a next first type transition edge that is next to the second type transition edge.

2. The device according to claim 1, wherein the command decoder is configured to delay outputting the precharge signal by a half cycle of the synchronous signal, in the test mode.

3. The device according to claim 2, further comprising:

a test mode circuit coupled to the command decoder, the test mode circuit being configured to supply a test mode signal to the command decoder, wherein the command decoder is configured to delay supplying the precharge signal to the control circuit, upon receipt of the test mode signal from the test mode circuit.

4. The device according to claim 1, further comprising:
a control circuit coupled to the command decoder,
wherein the command decoder is configured to supply the precharge signal to the control circuit, to enable the control circuit to perform precharge control, and
wherein the command decoder is configured to supply the active signal to the control circuit, to enable the control circuit to start active control before the control circuit completes precharge control.

5. The device according to claim 1, wherein the command decoder is configured to recognize activation of an internal circuit of the device in response to an input of an act command that is to activate the internal circuit, and
the command decoder is configured to recognize inactivation of the internal circuit in response to an input of a precharge command that is to inactivate the internal circuit.

6. The device according to claim 1, further comprising:
a control circuit coupled to the command decoder,
wherein the command decoder is configured to recognize and hold a precharge command that is to inactivate the device, in response to a first type transition edge of a first cycle of the synchronous signal,
wherein the command decoder is configured to supply the precharge signal to the control circuit, in the test mode, in response to a second type transition of a second cycle next to the first cycle,
wherein the command decoder is configured to recognize an active command that is to activate the device and supply the active signal to the control circuit, in response to a first type transition edge of the second cycle.

7. The device according to claim 6, further comprising:
a test mode circuit coupled to the command decoder, the test mode circuit being configured to recognize a mode register command in a first transition edge of a previous cycle previous to the first cycle, and supply a test mode signal to the command decoder.

8. The device according to claim 1, wherein the command decoder comprises:
a first capturing unit configured to recognize and hold active operation of the device in response to the first type transition edge of the synchronous signal;
a first output unit coupled to the first capturing unit to receive the first signal from the first capturing unit and to output the first signal in response to the next first type transition edge that is next to the first type transition edge;
a second capturing unit configured to recognize and hold inactive operation of the device in response to the first type transition edge of the synchronous signal; and
a second output unit coupled to the second capturing unit to receive the second signal from the second capturing unit,
wherein the second capturing unit is configured to output, in the normal operation mode, the second signal in response to the next first type transition edge, and
wherein the second capturing unit is configured to output, in the test mode, the second signal in response to the second type transition edge that is next to the first type transition edge.

9. The device according to claim 8, further comprising:
a plurality of internal circuits; and a control circuit coupled to the command decoder, the control circuit being coupled to each of the plurality of internal circuits, the control circuit being configured to supply an activation signal or an inactivation signal to each of the plurality of internal circuits, in response to the first and second signals from the first and second output units, respectively.

10. The device according to claim 9, wherein the control circuit is configured to output, upon input of the first signal, a selected one of the activation signal and the inactivation signal, the selection being performed in accordance with a respective operational state of each of the plurality of internal circuits, and
wherein the control circuit is configured to output, upon input of the second signal, the other of the activation signal and the inactivation signal.

11. The device according to claim 8, wherein the second output unit comprises:
a first shift unit configured to shift the second signal by a half cycle of the synchronous signal.

12. The device according to claim 1, wherein the command decoder comprises:
a delay circuit configured to delay, in the test mode, outputting the precharge signal by a half cycle of the synchronous signal.

13. The device according to claim 1, further comprising:
a memory cell array;
a row decoder coupled to the memory cell array;
a sense amplifier coupled to the memory cell array;
a column decoder coupled to the sense amplifier; and
a control circuit coupled to the row decoder, the sense amplifier, and the column decoder, the control circuit being coupled to the command decoder to receive the precharge signal and the active signal from the command decoder.

14. A device comprising:
a command decoder configured to output a precharge signal and an active signal in synchronous with a clock,
wherein a first time period between outputting the precharge signal and outputting the active signal in a test mode is shorter than a second time period of between outputting the precharge signal and outputting the active signal in a normal operation mode.

15. The device according to claim 14, wherein the command decoder is configured to output, in the normal operation mode, the precharge signal in response to a first type transition edge of the clock,
the command decoder is configured to output, in the normal operation mode, the active signal in response to a next first type transition edge that is next to the first type transition edge,
the command decoder is configured to output, in the test mode, the precharge signal in response to a second type transition edge of the clock, the second type transition edge being next to the first type transition edge, and
the command decoder is configured to output, in the test mode, the active signal in response to the next first type transition edge.

16. The device according to claim 14, wherein the first time period is a half of the second time period.

17. A method of controlling a device, the method comprising:
in a normal operation mode, outputting a precharge signal in response to a first type transition edge of a synchronous signal, and an active signal in response to a next first type transition edge that is next to the first type transition edge, and in a test mode, outputting, the precharge signal in response to a second type transition edge of the synchronous signal, and the active signal in response to a next first type transition edge that is next to the second type transition edge.

18. The method according to claim 17, further comprising:
recognizing and holding a precharge command in response to a first type transition edge of a first cycle of the synchronous signal;

in the test mode, supplying the precharge signal from the command decoder to a control circuit, in response to a second type transition of a second cycle next to the first cycle;

recognizing and holding an active command that is to activate the device; and supplying the active signal from the command decoder to the control circuit, in response to a first type transition edge of the second cycle.

19. The method according to claim 17, further comprising:
recognizing a mode register command in a first transition edge of a previous cycle previous to the first cycle; and
supplying a test mode signal to the command decoder.

20. The method according to claim 17, further comprising:
in the test mode, performing a delay in outputting the precharge signal by a half cycle of the synchronous signal, and in the normal operation mode, performing no delay in outputting the precharge signal.

* * * * *